(12) United States Patent
Noguchi

(10) Patent No.: US 8,726,106 B2
(45) Date of Patent: May 13, 2014

(54) SEMICONDUCTOR DEVICE HAVING REDUNDANT SELECT LINE TO REPLACE REGULAR SELECT LINE

(76) Inventor: Hidekazu Noguchi, Tokyo (JP)

( * ) Notice: Subject to any disclaimer, the term of this patent is extended or adjusted under 35 U.S.C. 154(b) by 126 days.

(21) Appl. No.: 13/533,583

(22) Filed: Jun. 26, 2012

(65) Prior Publication Data

US 2013/0007510 A1 Jan. 3, 2013

(30) Foreign Application Priority Data

Jul. 1, 2011 (JP) .................... 2011-147416

(51) Int. Cl.
*G11C 29/00* (2006.01)

(52) U.S. Cl.
USPC ........................ 714/711; 714/763

(58) Field of Classification Search
USPC ............ 365/230.03, 200; 714/710, 711, 763, 714/769

See application file for complete search history.

(56) References Cited

U.S. PATENT DOCUMENTS

| | | | | |
|---|---|---|---|---|
| 5,978,306 A | * | 11/1999 | Tsai | 365/230.03 |
| 5,999,463 A | * | 12/1999 | Park et al. | 365/200 |
| 6,061,291 A | * | 5/2000 | Zheng | 365/230.06 |
| 6,118,712 A | * | 9/2000 | Park et al. | 365/200 |
| 6,400,618 B1 | * | 6/2002 | Nakamura et al. | 365/200 |
| 6,668,344 B1 | * | 12/2003 | Sakata et al. | 714/710 |

FOREIGN PATENT DOCUMENTS

JP 2006-179114 A 7/2000

* cited by examiner

*Primary Examiner* — David Ton
(74) *Attorney, Agent, or Firm* — Foley & Lardner LLP

(57) ABSTRACT

Disclosed herein is a semiconductor device that includes selection lines selected based on an access address, a first hit signal generation circuit activating a first hit signal when the access address is coincident with a programmed address that designates a defective selection line included in the selection lines, and a first redundant selection line selected when the first hit signal is activated. The first hit signal generation circuit deactivates the first hit signal when a value of the access address is in a first address range even if the access address is coincident with the programmed address.

20 Claims, 20 Drawing Sheets

| X13, X12, X11 | F13 | F12 | F11 |
|---|---|---|---|
| 0,0,0 | FT | FT | FT |
| 0,0,1 | FT | FT | FB |
| 0,1,0 | FT | FB | FT |
| 0,1,1 | FT | FB | FB |
| 1,0,0 | FB | FT | FT |
| 1,0,1 | FB | FT | FB |
| 1,1,0 | FB | FB | FT |
| 1,1,1 | FB | FB | FB |

FIG.13

SEMICONDUCTOR DEVICE HAVING REDUNDANT SELECT LINE TO REPLACE REGULAR SELECT LINE

This application is claims benefit of priority from Japanese patent application no. 2011-147416, filed Jul. 1, 2011, the entire contents of which is incorporated herein by reference.

BACKGROUND OF THE INVENTION

1. Field of the Invention

The present invention relates to a semiconductor device, and particularly to a semiconductor device equipped with a redundant selection line that replaces a selection line such as a defective word line.

2. Description of Related Art

In DRAM (Dynamic Random Access Memory), which is a typical semiconductor memory device, a very large number of memory cells are contained. In recent years, there have been products with a storage capacity of 1 G bits or more per chip. Therefore, it is difficult to make all the memory cells operate properly, and some of the memory cells become defective in production process. Defective memory cells are replaced with spare memory cells in production process. As a result, the semiconductor memory device is shipped as a normal product.

In general, the replacement of memory cells is performed in units of word or bit lines. That is, a defective word line is replaced with a redundant word line, and a defective bit line with a redundant bit line. To each of the redundant word lines and redundant bit lines, a corresponding hit signal generation circuit is assigned. The hit signal generation circuit which may be also referred to as an address determination circuit. If an address for which an access request has been made matches an address of a defective word line or defective bit line, a hit signal output from a corresponding hit signal generation circuit becomes activated. As a result, the redundant word line or redundant bit line is selected.

The hit signal generation circuit usually includes a fuse circuit, which stores addresses of defective word lines or defective bit lines, as well as an enable fuse circuit, which selects whether or not to use the hit signal generation circuit. For example, if the enable fuse circuit is in a state of being programmed, then the hit signal generation circuit is in a state of being used. As a result, a comparison of an address to which access is requested with an address of a defective word line or defective bit line is effectively made. By contrast, if the enable fuse circuit is in a state of not being programmed, then the hit signal generation circuit is in a state of not being used. As a result, a comparison of an address to which access is requested with an address of a defective word line or defective bit line is not made. The use of such an enable fuse circuit prevents an incorrect replacement operation.

However, if each hit signal generation circuit is provided with an enable fuse circuit, a required area occupied by the hit signal generation circuits on the semiconductor chip increases accordingly. To solve the problem, what is proposed in Japanese Patent Application Laid-Open No. 2006-179114 is a hit signal generation circuit from which an enable fuse circuit has been removed. In the hit signal generation circuit disclosed in Japanese Patent Application Laid-Open No. 2006-179114, if any one of a plurality of fuse circuits that store addresses of defective word lines or defective bit lines is in the state of being programmed, then the hit signal generation circuit is regarded as being in the state of being used, thereby requiring no enable fuse circuit.

However, in the hit signal generation circuit disclosed in Japanese Patent Application Laid-Open No. 2006-179114, in order to make a determination as to whether or not the hit signal generation circuit is in the state of being used, a logical sum and synthesis operation of all outputs of a fuse circuit used for storing addresses is required. Therefore, a relatively large number of circuit elements are required. Therefore, while the enable fuse circuit is eliminated, a semiconductor device that can make a determination as to whether or not the hit signal generation circuit is in the state of being used with the use of a smaller number of circuit elements is desirable.

SUMMARY

In an aspect of this disclosure, there is provided a semiconductor device that includes: a plurality of selection lines each connected to a plurality of memory cells, the selection lines being selected based on an access address to which access is requested; a first hit signal generation circuit activating a first hit signal when the access address is coincident with a programmed address that designates a defective selection line included in the selection lines; and a first redundant selection line connected to a plurality of first redundant memory cells, the first redundant selection line being selected when the first hit signal is activated. The first hit signal generation circuit deactivates the first hit signal when a value of the access address is in a first address range even if the access address is coincident with the programmed address.

Another aspect of the disclosure, there is provided a semiconductor device that includes; a plurality of selection lines each connected to a plurality of memory cells; a first redundant selection line connected to a plurality of first redundant memory cells: a first hit signal generation circuit including a first storing unit, a first enable signal generation unit and a first hit signal generation unit, the first storing unit being configured to store a first defective address that comprises first and second address portions, the first enable signal generation unit receiving the first address portion of the first defective address without receiving the second address portion of the first defective address and producing a first enable signal in response to the first address portion, and the first hit signal generation unit receiving the first defective address, the first enable signal and an access address that is designates one of the selection lines and activating a first hit signal to activate the first redundant selection line when the first enable signal is supplied and the access address coincides with the first defective address.

Another aspect of the disclosure provides a semiconductor device that includes; a storing unit being configured to store a first address that comprises first and second address portions; an enable signal generation unit receiving the first address portion of the first address without receiving the second address portion of the first address and producing an enable signal in response to the first address portion; and an output signal generation unit receiving the first address, the enable signal and a second address, activating an output signal when the first enable signal is supplied and the second address coincides with the first address, and deactivating the output signal when the enable signal is not supplied.

BRIEF DESCRIPTION OF THE DRAWINGS

FIG. 13 is a table showing input sources for the NAND gate circuit 42 in the hit signal generation circuit 40 assigned to each group;

FIG. 19 is a circuit diagram of a hit signal generation circuit 40a;

FIG. 22 is a circuit diagram of a hit signal generation circuit 50a; and

DETAILED DESCRIPTION OF THE EMBODIMENT

Preferred embodiments of the present invention will be explained below in detail with reference to the accompanying drawings.

Figure 1:
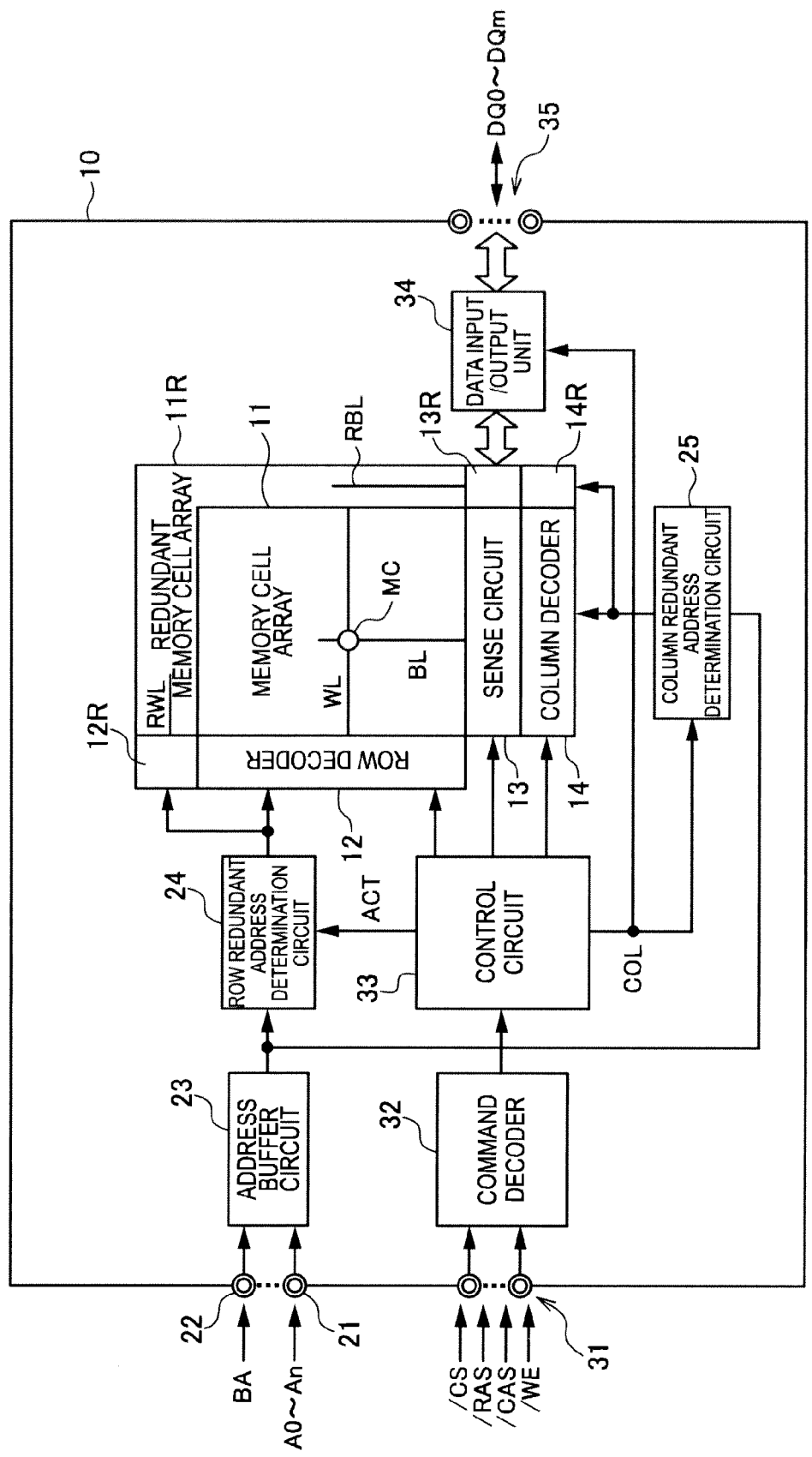
FIG. 1 is a block diagram of an entire semiconductor device 10 according to an embodiment of the present invention.

Referring now to FIG. 1, the semiconductor device 10 according to the present embodiment is a DRAM includes a memory cell array 11. In the memory cell array 11, a plurality of word lines WL and a plurality of bit lines BL are provided. At the intersection points of the word and bit lines WL and BL, memory cells MC are disposed. However, in FIG. 1, only one word line WL, one bit line BL, and one memory cell MC are shown. The memory cell MC has a first volatile memory element having a first structure.

The word lines WL are selected by a row decoder 12. To the row decoder 12, address signals A0 to An are supplied via an address terminal 21, an address buffer circuit 23, and a row redundant address determination circuit 24. The row redundant address determination circuit 24 captures the address signals A0 to An supplied from the address buffer circuit 23 at a time when an active signal ACT supplied from a control circuit 33 becomes activated, and controls the row decoder 12 and a redundant row decoder 12R. The active signal ACT is a signal that becomes activated at a time when a command decoder 32 determines that a command signal supplied from the outside via a command terminal 31 represents a predetermined combination (active command). The command signal supplied to the command terminal 31 is made up of a chip selection signal /CS, a row address strobe signal /RAS, a column address strobe signal /CAS, and a write enable signal /WE.

Furthermore, as shown in FIG. 1, in the semiconductor device 10, a redundant memory cell array 11R is provided. The redundant memory cell array 11R includes redundant word lines RWL and redundant bit lines RBL. The redundant word lines RWL are selected by the redundant row decoder 12R. The redundant row decoder 12R becomes activated by the row redundant address determination circuit 24 at a time when a row address to which access is requested is a row address corresponding to a defective word line. As a result, the defective word line is replaced with a redundant word line RWL.

Meanwhile, the bit lines BL contained in the memory cell array 11 are connected to sense amplifies in a sense circuit 13. The sense amplifies are selected by a column decoder 14. To the column decoder 14, address signals A0 to An are supplied via the address terminal 21, the address buffer circuit 23, and a column redundant address determination circuit 25. The column redundant address determination circuit 25 captures the address signals A0 to An supplied from the address buffer circuit 23 at a time when a column signal COL supplied from the control circuit 33 becomes activated, and controls the column decoder 14 and a redundant column decoder 14R.

As shown in FIG. 1, a redundant sense circuit 13R and the redundant column decoder 14R are provided for the redundant memory cell array 11R. The redundant bit lines RBL and the redundant sense amplifiers connected to the redundant bit lines RBL are selected by the redundant column decoder 14R. The redundant column decoder 14R becomes activated by the column redundant address determination circuit 25 at a time when a column address to which access is requested is a column address corresponding to a defective bit line. As a result, the defective bit line is replaced with a redundant bit line RBL.

A sense amplifier or redundant sense amplifier selected by the column decoder 14 or redundant column decoder 14R is connected to a data input/output terminal 35 via a data input/output unit 34. Therefore, when the command signal represents a read operation, read data DQ0 to DQm read from a memory cell MC designated by the address signals A0 to An are output to the outside through the data input/output terminal 35. When the command signal represents a write operation, write data DQ0 to DQm that are supplied from the outside to the data input/output terminal 35 are written to a memory cell MC designated by the address signals A0 to An.

In reality, the memory cell array 11 and the redundant memory cell array 11R are divided into a plurality of banks. A bank that is to be selected from among the banks is designated by a bank address BA, which is supplied via an address terminal 22.

Figure 2:
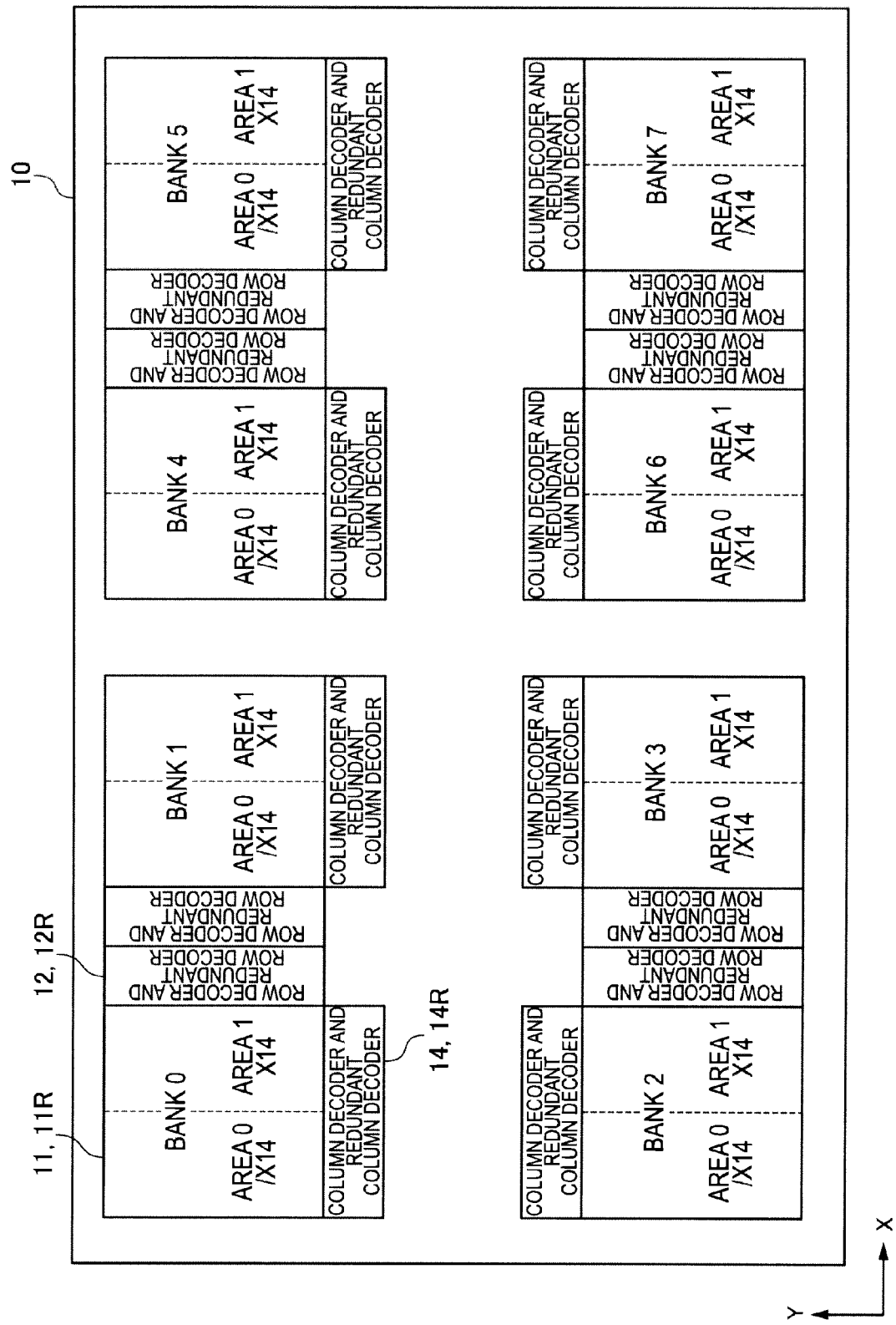
FIG. 2 is a schematic diagram for explaining the layout of the semiconductor device 10 shown in FIG. 1.

Turning to FIG. 2, in the semiconductor device 10 of the present embodiment, the memory cell array 11 and the redundant memory cell array 11R are divided into eight banks, banks 0 to 7. On an X-direction side of each bank, a row decoder 12 and a redundant row decoder 12R, which correspond to the bank, are disposed. On a Y-direction side of each bank, a column decoder 14 and a redundant column decoder 14R, which correspond to the bank, are disposed. In the present example, the address signals A0 to An are of a 15-bit structure, consisting of A0 to A14. An area 0 or 1 is selected by the most significant address bit A14. The most significant address bit A14 is a bit that is supplied at the time of row access, and is denoted by "X14" in the specification and drawings. Similarly, the address bits A0 to A13, which are supplied at the time of row access, are denoted by "X0" to "X13," respectively. Meanwhile, at the time of column access, the address bits A3 to A9 are supplied, and are denoted by "Y3" to "Y9," respectively.

Figure 3:
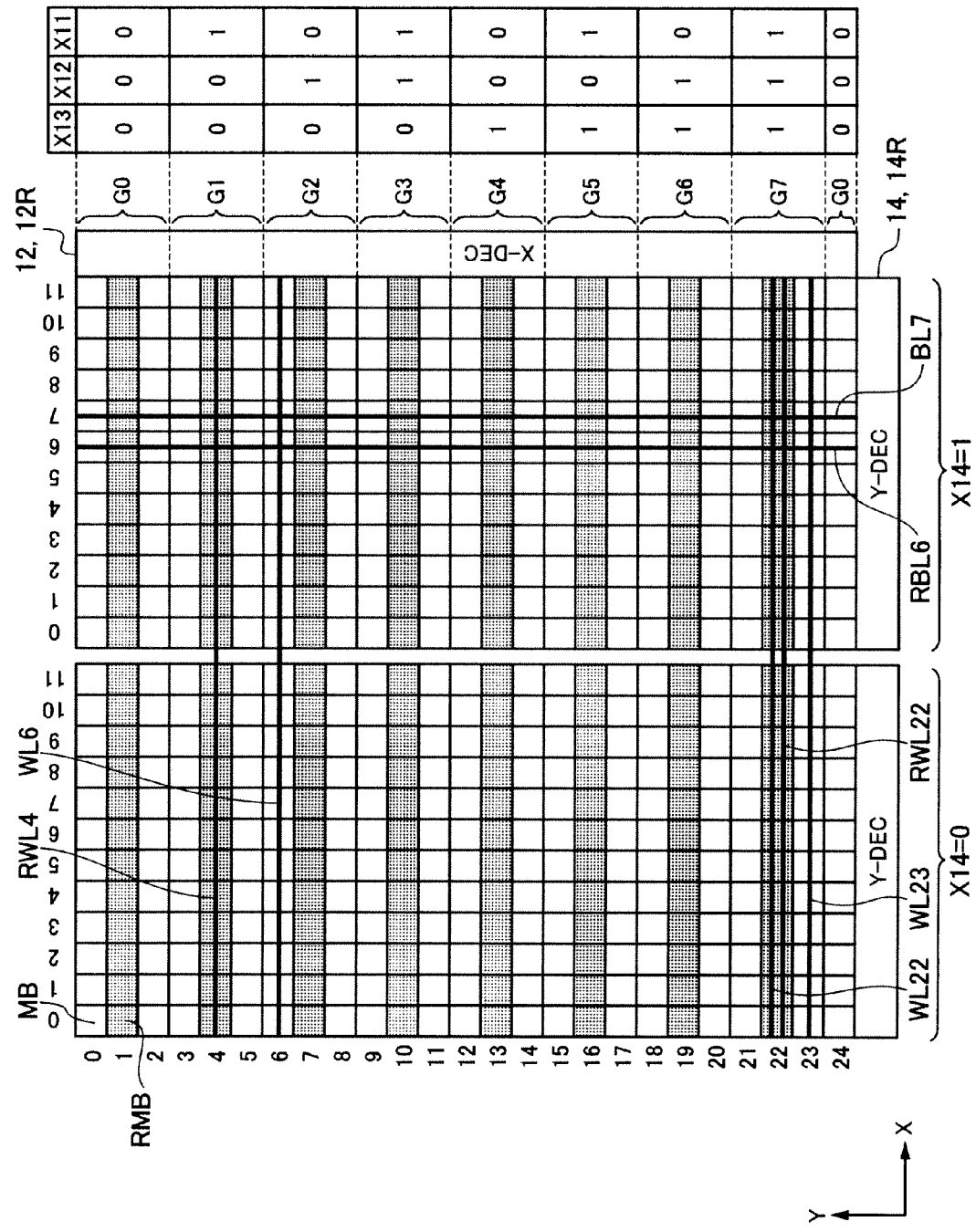
FIG. 3 is a schematic diagram for explaining the structure of one of banks shown in FIG. 2.

Turning to FIG. 3, in the semiconductor device 10 according to the present embodiment, one bank is divided into 24 memory blocks in the X-direction, and 25 memory blocks in the Y-direction. Among the 24 memory blocks divided in the X-direction, the 12 memory blocks in the left half are selected at a time when the value of the most significant address bit X14 is 0. The 12 memory blocks in the right half are selected at a time when the value of the most significant address bit X14 is 1. A memory block that is to be selected from among the selected 12 memory blocks is designated by a column address.

A memory block that is to be selected from the 25 memory blocks divided in the Y-direction is designated by address bits X13 to X9 of a row address. Incidentally, the memory blocks MB0 and MB24, which are positioned on the Y-direction edges, have half the storage capacity of other memory blocks. The storage capacity of the two memory blocks MB0 and MB24 combined is equal to that of one other memory block. The reason is that a so-called open-bit system is employed by the semiconductor device 10 of the present embodiment.

According to the present embodiment, in the 25 memory blocks divided in the Y-direction, each set of three blocks forms one group. As a result, eight groups G0 to G7 are formed. A group that is to be selected from among the groups is designated by address bits X13 to X11 of a row address. In one example, when the values of the address bits X13 to X11 all are 0 as shown in FIG. 3, the group G0 consisting of memory blocks MB0 to MB2 is selected. Incidentally, the group G0 consisting of the memory blocks MB0 to MB2 also contains a memory block MB24. The reason the group G0 contains the memory block MB24 is as described above.

Among the three memory blocks that make up each group, two are normal memory blocks MB containing no redundant word line, and the remaining one is a memory block RMB containing redundant word lines. In FIG. 3, the memory blocks RMB containing redundant word lines are hatched. In the example shown in FIG. 3, among the three memory blocks that make up each group, a Y-direction central memory block is a memory block RMB containing redundant word lines.

Although not being specifically restricted, according to the present embodiment, a memory block RMB hatched contains 16 redundant word lines RWL. While the details thereof will be described later, the redundant word lines RWL contained in each memory block RMB are not allowed to replace defective word lines WL belonging to the group thereof. In other words, each redundant word line RWL is able to replace only a defective word line WL belonging to another group. To give an actual example, when the word line WL6 shown in FIG. 3 is a defective word line, the replacement of the word line WL6 with the redundant word line RWL4 is allowed. The reason is that the word line WL6 and the redundant word line RWL4 belong to different groups. When the word line WL22 or WL23 shown in FIG. 3 is a defective word line, the replacement of the word line WL22 or WL23 with the redundant word line RWL22 is not allowed. The reason is that the word lines WL22 and WL23 and the redundant word line RWL22 belong to the same group.

Figure 4:
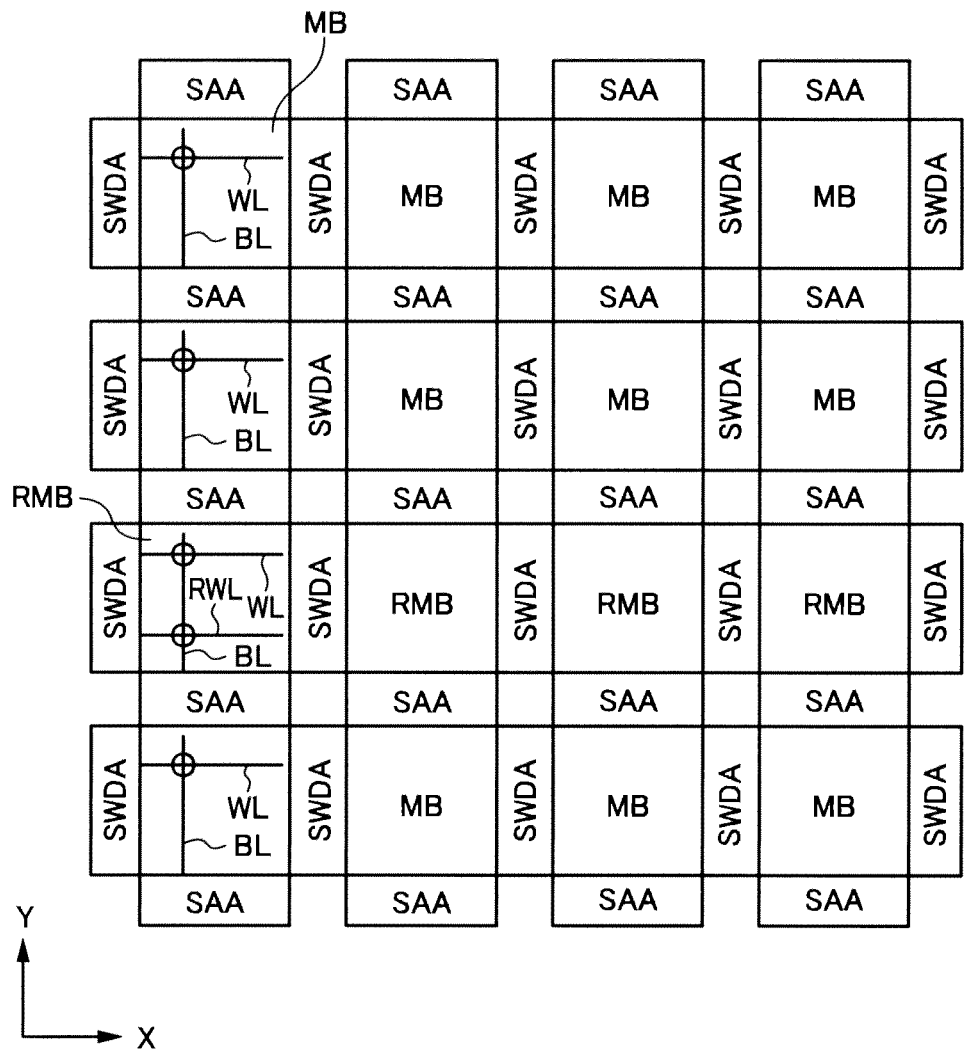
FIG. 4 is a schematic diagram showing the configuration of the memory blocks MB and RMB.

Turning to FIG. 4, the memory blocks MB and RMB are laid out in a matrix form in the X- and Y-directions. Between the memory blocks that are adjacent to each other in the X-direction, a sub-word driver array SWDA is disposed. Between the memory blocks that are adjacent to each other in the Y-direction, a sense amplifier array SAA is disposed. The sub-word driver array SWDA is a circuit block including a plurality of sub-word drivers, with each sub-word driver driving a corresponding word line WL. The sense amplifier array SAA is a circuit block including a plurality of sense amplifiers, with each sense amplifier amplifying a potential difference between a bit line BL provided in one of the memory blocks MB that are adjacent to each other in the Y-direction and a bit line BL provided in the other one of the memory blocks MB that are adjacent to each other in the Y-direction. Moreover, a redundant word line RWL is added to the memory block RMB. Incidentally, in FIG. 4, any redundant bit line is not shown.

Figure 5:
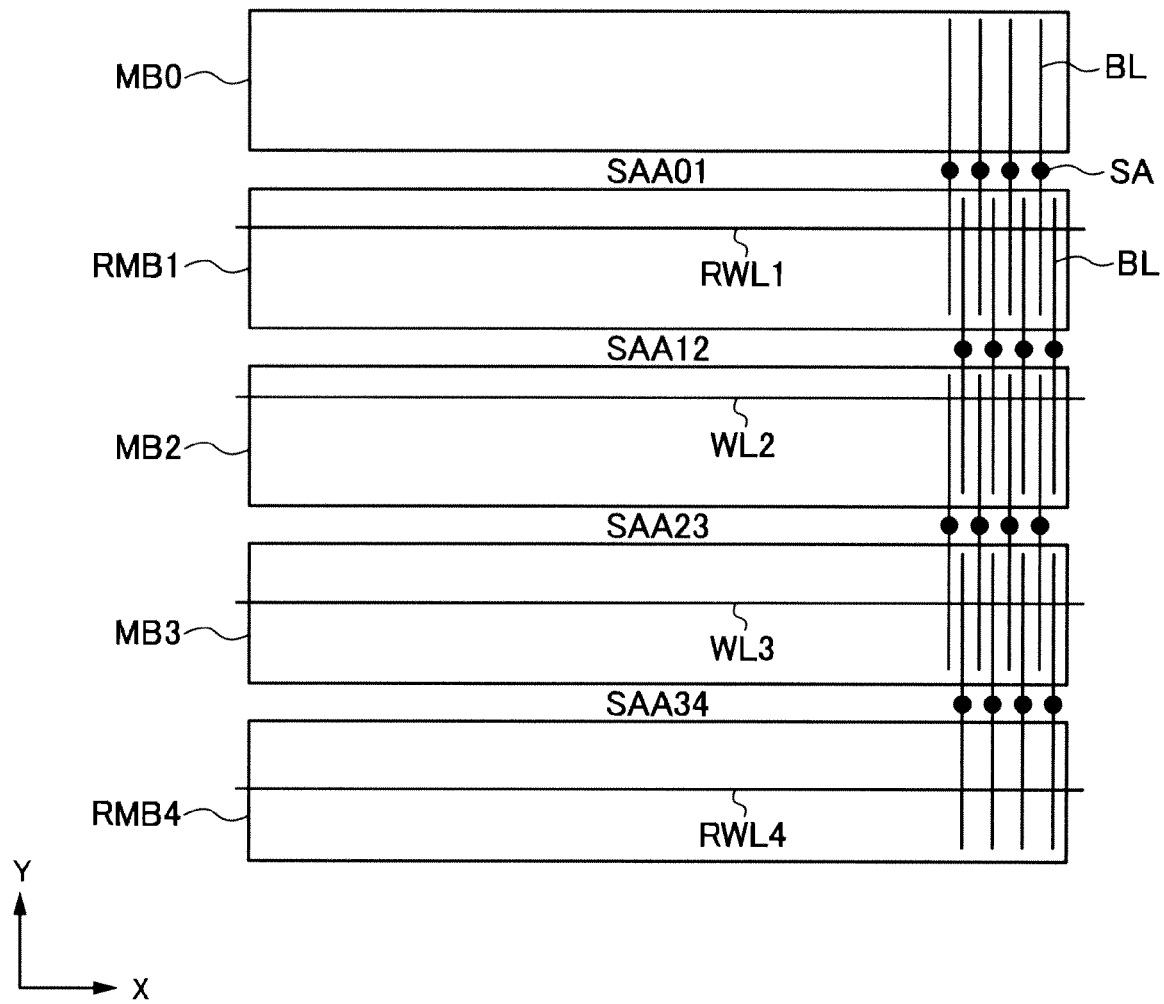
FIG. 5 is a schematic diagram for explaining the reason why a defective word line WL cannot be replaced with a redundant word line RWL belonging to the group thereof.

FIG. 5 shows the memory blocks MB0 to RMB4 in order to explain the reason why a defective word line WL cannot be replaced with a redundant word line RWL belonging to the group thereof. Between the memory blocks that are adjacent to each other in the Y-direction, a sense amplifier array SAA is disposed. In the sense amplifier array SAA, a plurality of sense amplifiers SA arranged in the X-direction are contained. In FIG. 5, one sense amplifier SA is shown by a black circle. Each sense amplifier SA is connected to two bit lines BL, and plays a role in amplifying a potential difference therebetween. The two bit lines BL belong to the two memory blocks that are adjacent to each other in the Y-direction. In other words, among a plurality of bit lines BL belonging to a given memory block MB, half of the bit lines BL are connected to a sense amplifier array SAA provided on one side in the Y-direction, and the remaining half to a sense amplifier array SAA provided on the other side in the Y-direction. Therefore, when a word line WL is selected, the sense amplifier arrays SAA on both sides of the memory block thereof become activated.

Accordingly, for example, if the word line WL2 belonging to the memory block MB2 is selected, both the sense amplifier arrays SAA12 and SAA23 end up becoming activated, meaning that, if the word line WL2 is selected, the word lines RWL1 and WL3 belonging to the adjacent memory blocks RMB1 and MB3 cannot be selected (Replacement prohibition condition). Therefore, if the semiconductor device is so designed that access to a defective word line is not suspended even during a replacement operation, the defective word line cannot be replaced with the redundant word line RWL1 even when the word line WL2 is the defective word line. When the semiconductor device is so designed that access to a defective word line is not suspended even during a replacement operation, the row decoder 12 shown in FIG. 1 selects a predetermined word line WL on the basis of a row address to which access is requested regardless of whether or not to select a redundant word line RWL.

When the word line WL2 is a defective word line, it is possible to replace the word line WL2 with the redundant word line RWL4 in the memory block RMB4. The reason is as follows: even if the semiconductor device is so designed that access to a defective word line is not suspended during a replacement operation, the conflict of data does not occur even when the word line WL2 and the redundant word line RWL 4 are simultaneously selected because a sense amplifier SA is not shared by the word line WL2 and the redundant word line RWL4.

According to the present embodiment, the three memory blocks that are arranged in the Y-direction forms one group, and the central block thereof is a memory block RMB containing a redundant word line RWL. Therefore, a defective word line WL cannot be replaced with a redundant word line RWL belonging to the group thereof, meaning that, to each redundant word line RWL, as an address of a replacement-source defective word line WL, an address belonging to the group thereof is not assigned. According to the present embodiment, the above characteristic is used to eliminate an enable fuse circuit.

Figure 6:
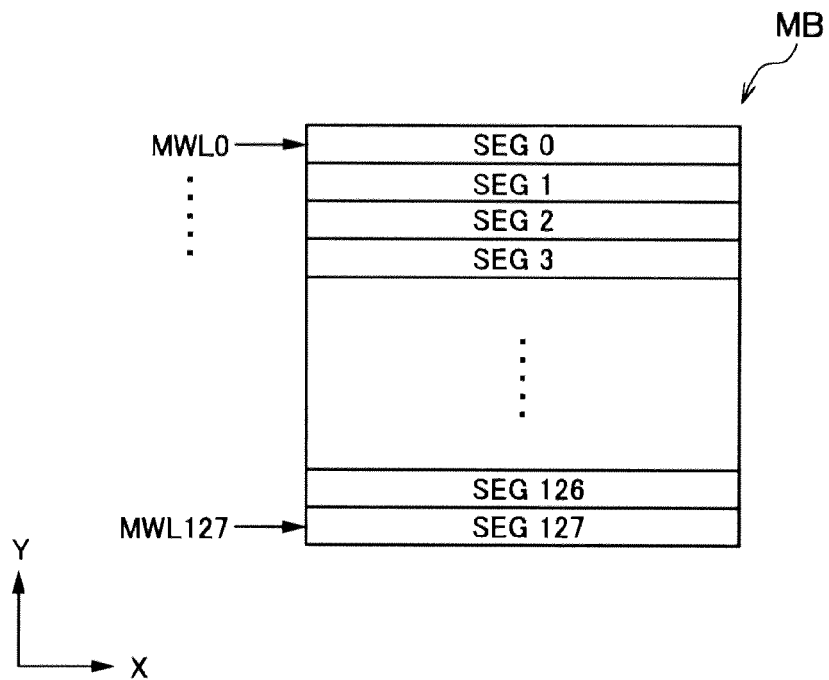
FIG. 6 is a schematic diagram for explaining the configuration of a memory block MB.

Turning to FIG. 6, the memory block MB containing no redundant word line is divided into 128 segments, which are arranged in the Y-direction. The segments SEG0 to SEG127 are selected exclusively by address bits X8 to X2 of a row address. More specifically, the address bits X8 to X2 of a row address are decoded by the row decoder 12, and one of 128 main word lines MWL0 to MWL127, which respectively correspond to the segments SEG0 to SEG127, is activated. A segment corresponding to a main word line MWL activated is a segment to be accessed. The remaining address bits X1 and X0 of the row address are used to select a word line WL.

Figure 7:
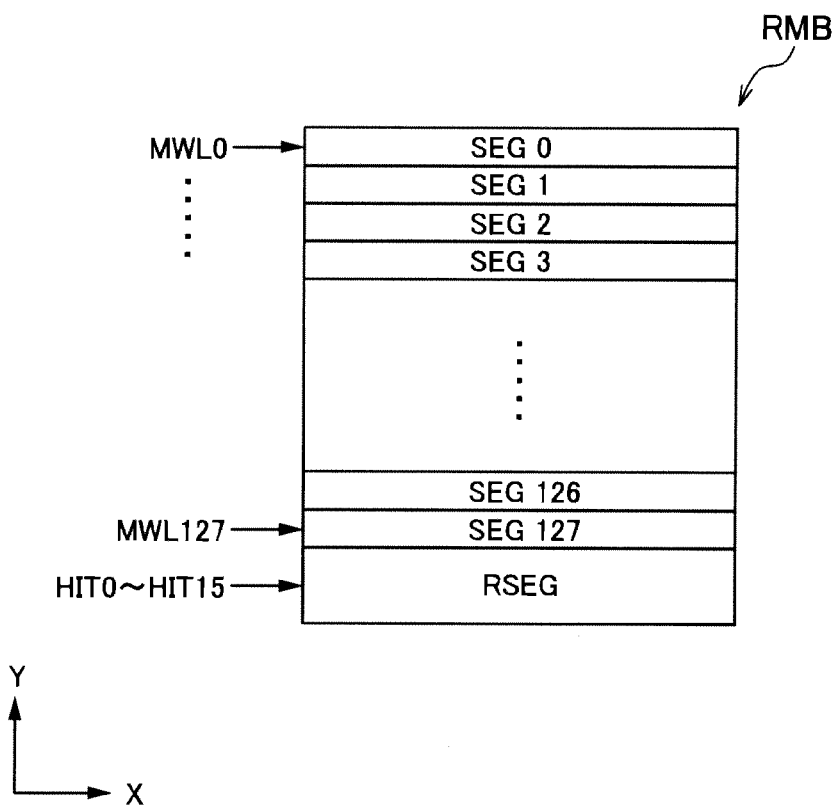
FIG. 7 is a schematic diagram for explaining the configuration of a memory block RMB.

Turning to FIG. 7, the memory block RMB containing redundant word lines has a redundant segment RSEG, as well as a similar configuration to that of the memory block MB shown in FIG. 6. The redundant segment RSEG contains 16 redundant word lines RWL, which are each selected by hit signals HIT0 to HIT15.

Figure 8:
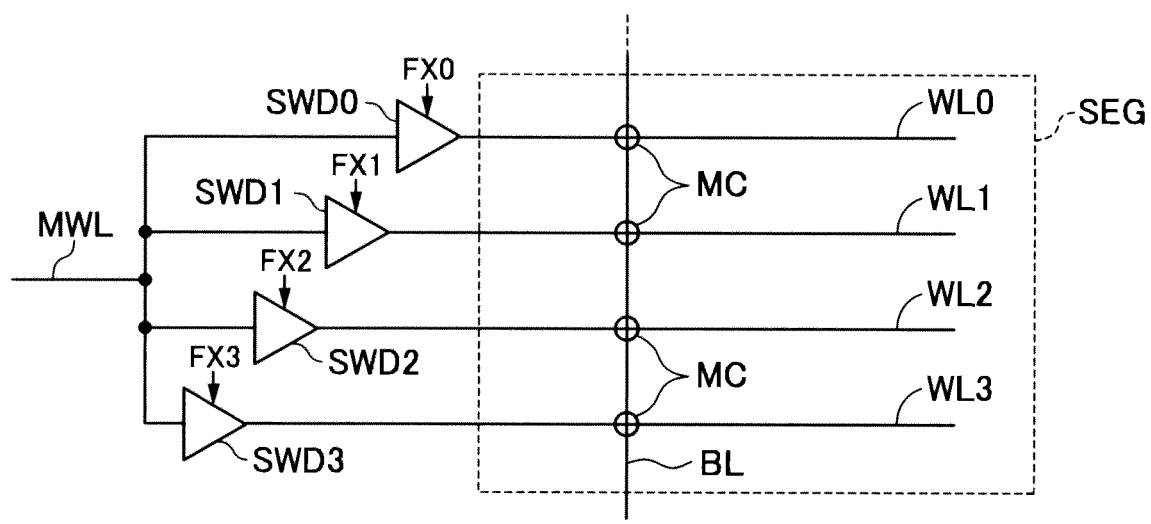
FIG. 8 is a schematic diagram for explaining the structure of a segment SEG.

Turning to FIG. 8, one segment SEG includes four word lines WL0 to WL3. At the intersection points of the word lines WL0 to WL3 and a bit line BL, memory cells MC are disposed. The word lines WL0 to WL3 are each driven by corresponding sub-word drivers SWD0 to SWD3. The sub-word drivers SWD0 to SWD3 drive the corresponding word lines WL0 to WL3 to a selection level at a time when the main word line MWL assigned to the segment thereof becomes activated and when the corresponding sub-word driving signals FX0 to FX3 become activated. The sub-word driving signals FX0 to FX3 are selected exclusively by address bits X1 and X0 of a row address. The above word lines WL0 to WL3 may be referred to as sub-word lines.

Figure 9:
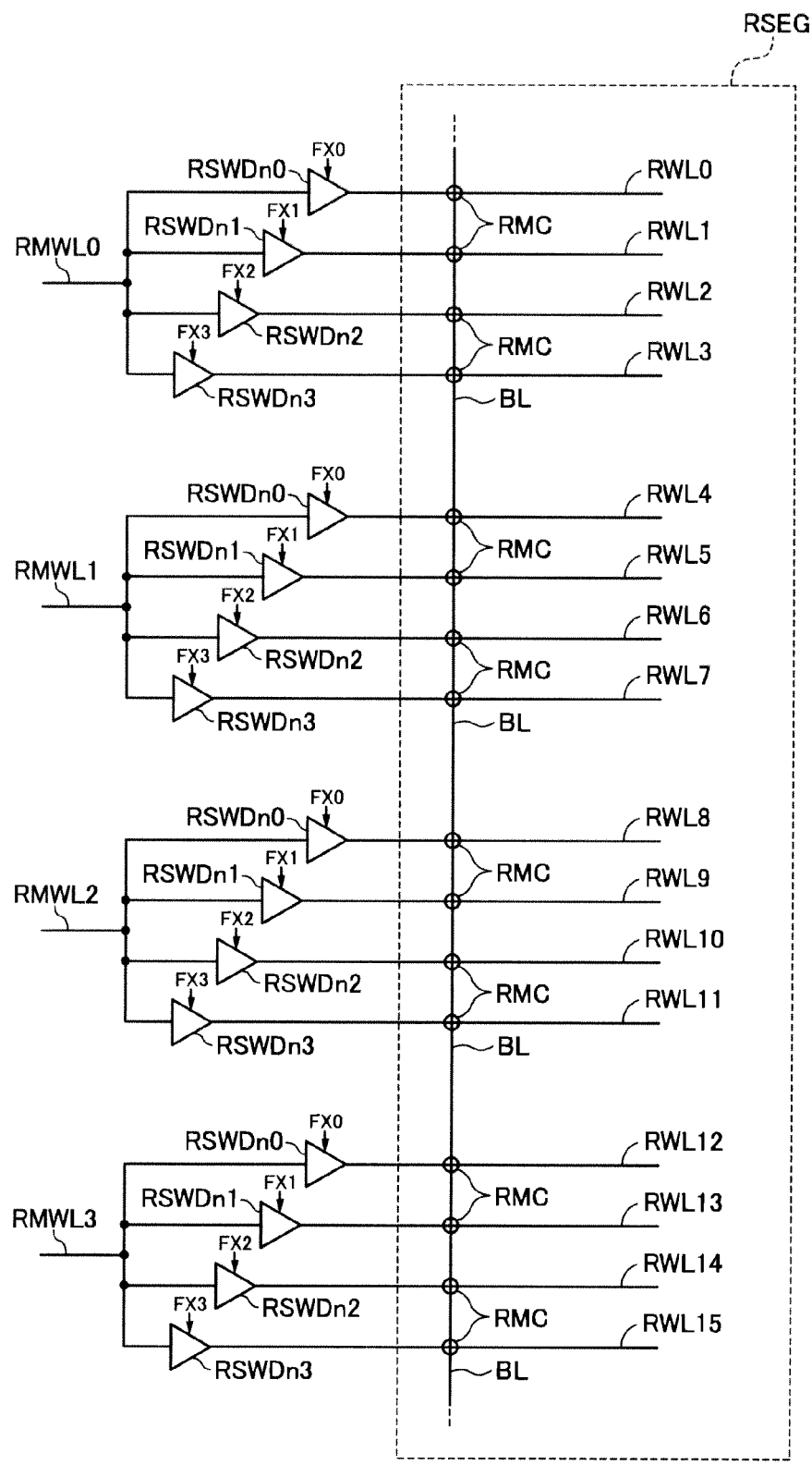
FIG. 9 is a schematic diagram for explaining the configuration of a redundant segment RSEG.

Turning to FIG. 9, the redundant segment RSEG includes 16 redundant word lines RWL0 to RWL15. The redundant word lines RWL0 to RWL15 may be referred to as redundant sub-word lines. At the intersection points of the redundant word lines RWL0 to RWL15 and a bit line BL, redundant memory cells RMC are disposed. The redundant memory cells RMC are first volatile storage elements of a first structure. The redundant word lines RWL0 to RWL15 are each driven by corresponding redundant sub-word drivers RSWDn0 to RSWDn3. The redundant sub-word drivers RSWDn0 to RSWDn3 drive the corresponding redundant word lines RWL0 to RWL15 to a selection level at a time when corresponding redundant main word lines RMWL0 to RMWL3 become activated and when corresponding sub-word driving signals FX0 to FX3 become activated. As shown in FIG. 9, the redundant word lines RWL0 to RWL3 are assigned to the redundant main word line RMWL0. The redundant word lines RWL4 to RWL7 are assigned to the redundant main word line RMWL1. The redundant word lines RWL8 to RWL11 are assigned to the redundant main word line RMWL2. The redundant word lines RWL12 to RWL15 are assigned to the redundant main word line RMWL3.

Figure 10:
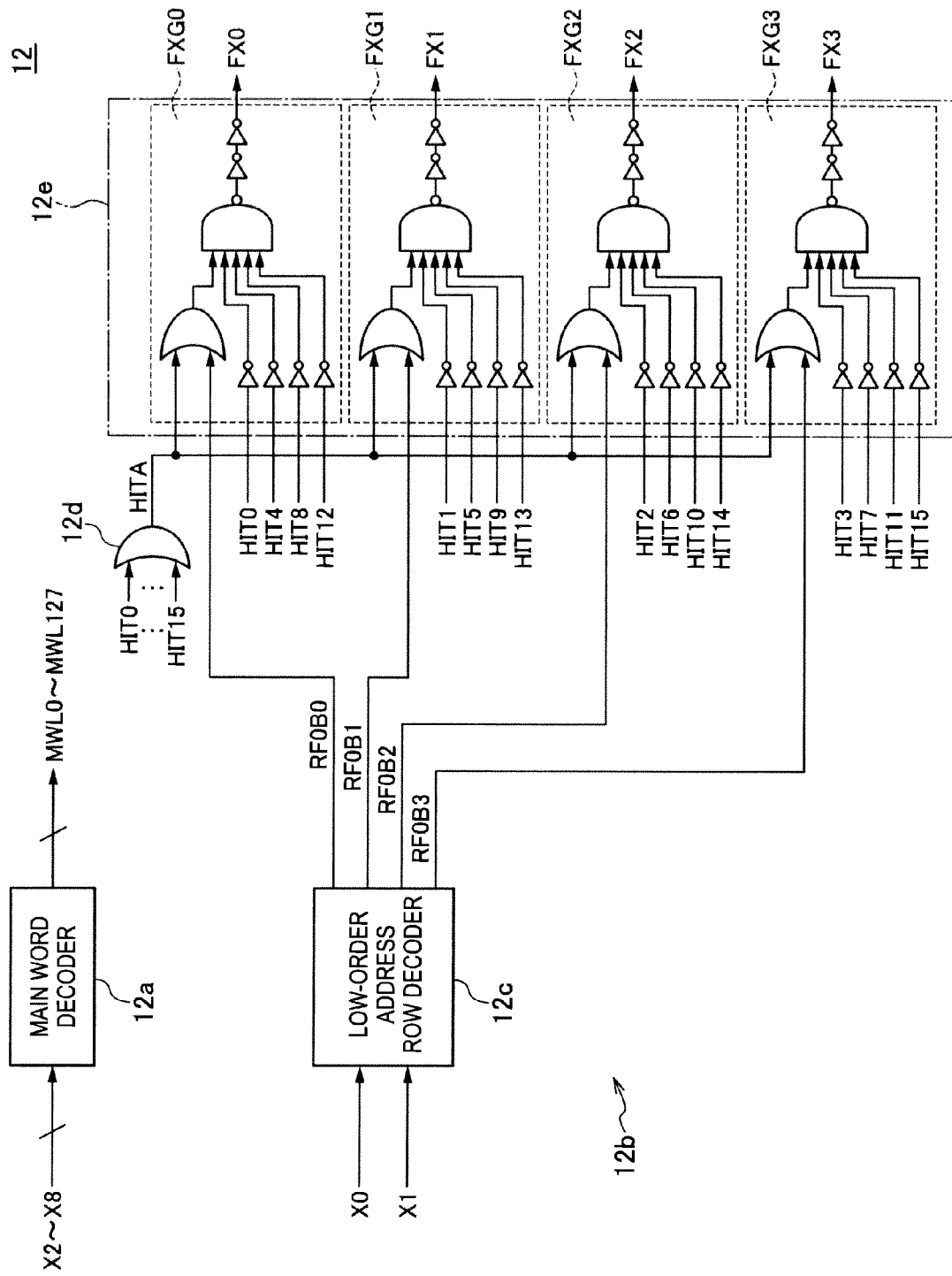
FIG. 10 is a block diagram showing the configuration of the row decoder 12 shown in FIG. 1.

Turning to FIG. 10, the row decoder 12 includes a main word decoder 12a, which activates one of the main word lines MWL0 to MWL127; and a sub-word decoder 12b, which generates the sub-word driving signals FX0 to FX3. The main word decoder 12a is a circuit that decodes seven bits, which are high-order bits X2 to X8 of a row address. As a result, one of the main word lines MWL0 to MWL127 becomes activated.

The sub-word decoder 12b includes a low-order address row decoder 12c, an OR gate circuit 12d, and a sub-word driving signal generation unit 12e. The low-order address row decoder 12c is a circuit that decodes two bits, which are low-order bits X0 and X1 of a row address. As a result, one of sub-word selection signals RF0B0 to RF0B3 becomes activated. In this case, the sub-word selection signals RF0B0 to RF0B3 are low-active signals. That is, the low-order address row decoder 12c sets one of the sub-word selection signals RF0B0 to RF0B3 to a low level in response to the row address bits X0 and X1. The sub-word selection signals RF0B0 to RF0B3 are each supplied to sub-word driving signal generation circuits FXG0 to FXG3, which make up the sub-word driving signal generation unit 12e.

The OR gate circuit 12d carries out a logical sum operation of hit signals HIT0 to HIT 15. The hit signals HIT0 to HIT 15 are generated by the row redundant address determination circuit 24 shown in FIG. 1. An output signal HITA of the OR gate circuit 12d is supplied in common to the sub-word driving signal generation circuits FXG0 to FXG3, which make up the sub-word driving signal generation unit 12e.

The sub-word driving signal generation circuit FXG0 receives the output signal HITA of the OR gate circuit 12d, the sub-word selection signal RF0B0, and the hit signals HIT0, HIT4, HIT8 and HIT12, and generates a sub-word driving signal FX0 on the basis of the logical levels of the received signals. More specifically, when the sub-word selection signal RF0B0 is at a non-active level (high level) and when the hit signals HIT0, HIT4, HIT8 and HIT12 all are at a non-active level (low level), the sub-word line driving signal FX0 is brought into a non-active level (low level). Meanwhile, when the sub-word selection signal RF0B0 is at an active level (low level) and when the hit signals HIT0, HIT4, HIT8 and HIT12 all are at a non-active level (low level), the sub-word line driving signal FX0 is brought into an active level (high level). When one of the hit signals HIT0, HIT4, HIT8 and HIT12 is at an active level (high level), the sub-word line driving signal FX0 is brought into an active level (high level) regardless of the logical level of the sub-word selection signal RF0B0.

Similarly, the sub-word driving signal generation circuit FXG1 brings the sub-word driving signal FX1 to an active level at a time when the sub-word selection signal RF0B1 and one of the hit signals HIT1, HIT5, HIT9 and HIT13 are at an active level. The sub-word driving signal generation circuit FXG2 brings the sub-word driving signal FX2 to an active level at a time when the sub-word selection signal RF0B2 and one of the hit signals HIT2, HIT6, HIT10 and HIT14 are at an active level. The sub-word driving signal generation circuit FXG3 brings the sub-word driving signal FX3 to an active level at a time when the sub-word selection signal RF0B3 and one of the hit signals HIT3, HIT7, HIT11 and HIT15 are at an active level.

In that manner, the sub-word driving signal generation unit 12e activates one of the sub-word driving signals FX0 to FX3 depending on the sub-word selection signals RF0B0 to RF0B3 at a time when the hit signals HIT0 to HIT15 are all non-active. On the other hand, when one of the hit signals HIT0 to HIT15 is in an active state, the sub-word driving signal generation unit 12e activates one of the sub-word driving signals FX0 to FX3 depending on the hit signals HIT0 to HIT15 regardless of the sub-word selection signals RF0B0 to RF0B3.

Figure 11:
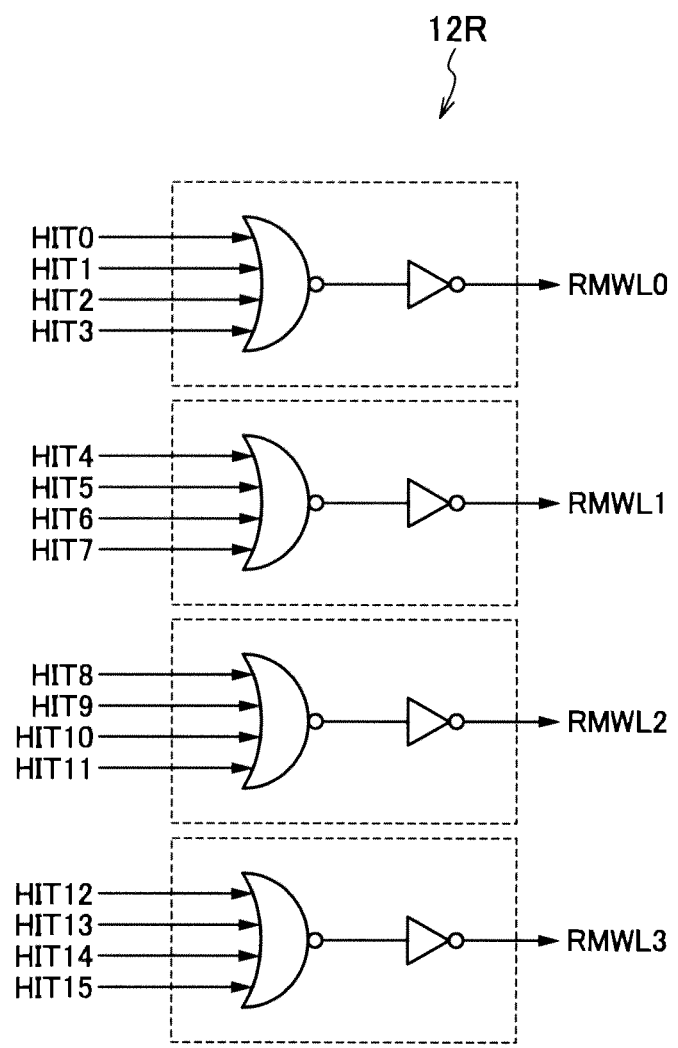
FIG. 11 is a circuit diagram of the redundant row decoder 12R shown in FIG. 1.

Turning to FIG. 11, the redundant row decoder 12R receives the hit signals HIT0 to HIT15, and activates one of the redundant main word lines RMWL0 to RMWL3. More specifically, when one of the hit signals HIT0 to HIT3 is in an active state (high level), the redundant main word line RMWL0 becomes activated. When one of the hit signals HIT4 to HIT7 is in an active state (high level), the redundant main word line RMWL1 becomes activated. When one of the hit signals HIT8 to HIT11 is in an active state (high level), the redundant main word line RMWL2 becomes activated. When one of the hit signals HIT12 to HIT15 is in an active state (high level), the redundant main word line RMWL3 becomes activated.

Figure 12:
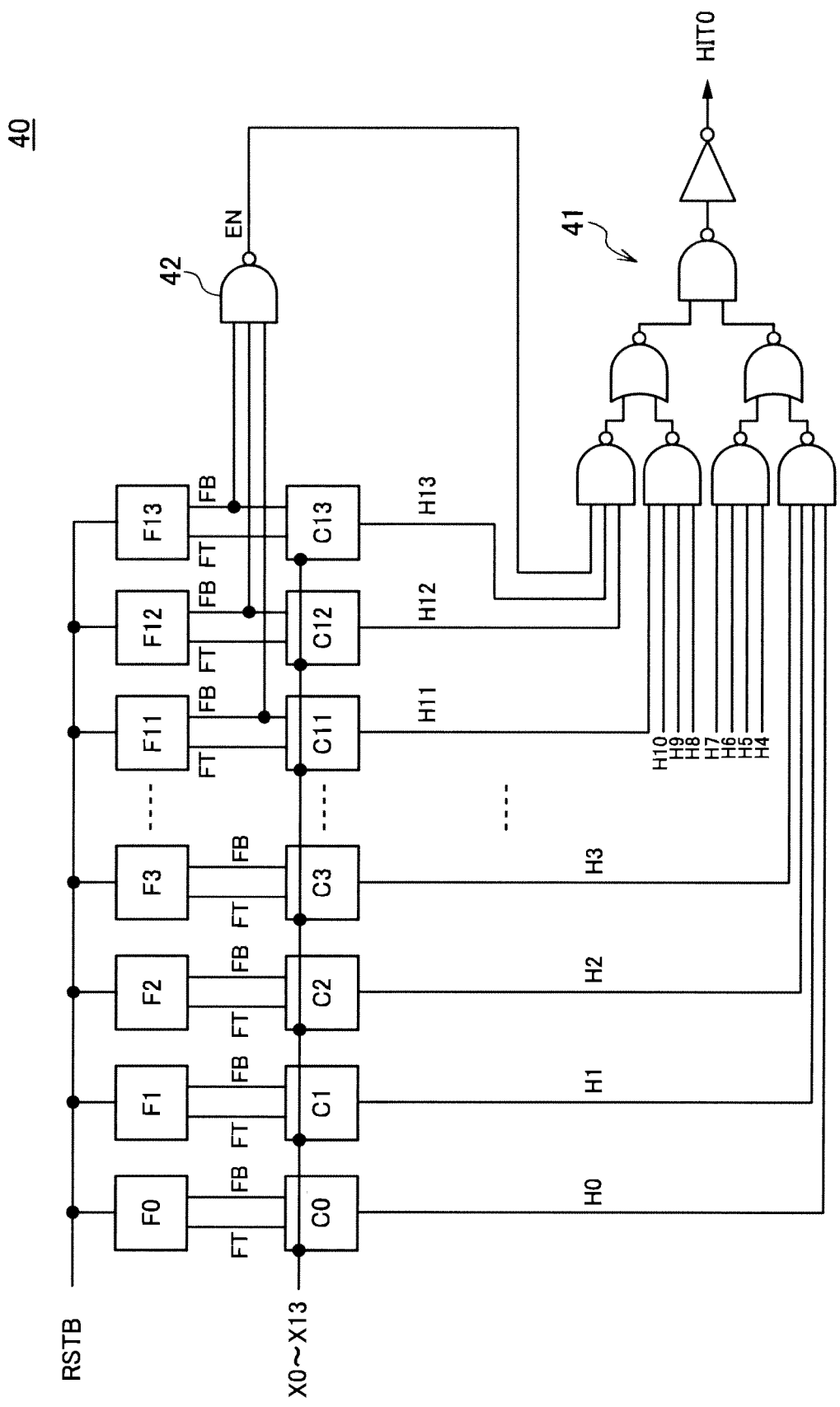
FIG. 12 is a circuit diagram of a hit signal generation circuit 40.

FIG. 12 is a circuit diagram of a hit signal generation circuit 40 that generates a hit signal HIT0 corresponding to a memory block RMB22. The hit signal generation circuit 40 is included in the row redundant address determination circuit 24 shown in FIG. 1. The hit signal generation circuits 40 that generate other hit signals HIT1 to HIT15 corresponding to the memory block RMB22 have the same circuit configuration. As described above with the use of FIG. 3, the memory block RMB22 belongs to the group G7, and is selected at a time when the address bits X13 to X11 of a row address all are 1.

As shown in FIG. 12, the hit signal generation circuit 40 includes fuse circuits F0 to F13, with no enable fuse circuit provided. The fuse circuits F0 to F13 correspond to address bits X0 to X13 of a defective word line WL to be replaced, respectively; and contain fuse elements to store corresponding logical values in a nonvolatile manner. The type of the fuse elements is not specifically limited. The following fuse elements can be used: optical fuse elements, which can be cut by irradiation of a laser beam, and electrical fuse elements, which can be connected by applying a high voltage and thereby breaking down a gate insulating film. The fuse circuits F0 to F13 execute an operation of reading from the fuse elements in response to a reset signal RSTB, which is supplied from the outside of the semiconductor device 10, and retains the logical values that the fuse circuits F0 to F13 have read. The circuit configuration of the fuse circuits will be described later.

The logical values stored in the fuse circuits F0 to F13 are each output in the form of complementary signals FT and FB, and are input to corresponding comparator circuits C0 to C13. The signal FT is a positive output signal, and the signal FB a negative output signal. From a programmed fuse circuit, the following are output: Positive signal FT=high level, and negative signal FB=low level. Meanwhile, from an un-programmed fuse element, the following are output: Positive signal FT=low level, and negative signal FB=high level. In this case, the "programmed fuse element" means a fuse element that has been cut by irradiation of a laser beam if an optical fuse element is used. If an electrical fuse element is used, the "programmed fuse element" means a fuse element whose insulation has broken down after a high voltage is applied.

The comparator circuits C0 to C13 are circuits that compare address bits X0 to X13 to which access is requested and the outputs of the fuse circuits F0 to F13. When both pieces of information match each other, the comparator circuits C0 to C13 activate corresponding match signals H0 to H13 to a high level. The match signals H0 to H13 are supplied to a hit determination circuit 41.

Furthermore, the hit signal generation circuit 40 includes a NAND gate circuit 42, to which negative outputs FB of the fuse circuits F11 to F13 are input as input signals. An enable signal EN output from the NAND gate circuit 42 is supplied to the hit determination circuit 41. Thus, when at least one of the fuse circuits F11 to F13 is in the state of being programmed, and when the address bits X0 to X13 to which access is requested all match the outputs of the fuse elements F0 to F13, the hit determination circuit 41 activates the hit signal HIT0 to a high level.

In that manner, at least one of the fuse circuits F11 to F13 in the state of being programmed is a condition for the hit determination circuit 41, which is contained in the hit signal generation circuit 40, to become activated. Conversely, when all the fuse circuits F11 to F13 are in the state of not being programmed, the hit determination circuit 41 becomes deactivated, disabling the results of comparison by the comparator circuits C0 to C13. Here, all the fuse circuits F11 to F13 are turned into the state of not being programmed only when an address stored in a fuse set consisting of the fuse circuits F0 to F13, i.e. an address of a defective word line WL, belongs to the group G7 shown in FIG. 3. As described above, each redundant word line RWL cannot replace a defective word line WL belonging to the group thereof. Therefore, such a prohibited address is used in generating the enable signal EN.

The range of prohibited addresses varies according to the group. Therefore, according to the present embodiment, the wire connection, which determines an input signal to the NAND gate circuit 42, varies according to the group.

Turning to FIG. 13, the input sources of the NAND gate circuit 42 correspond to the logical levels of the address bits X13 to X11, which determine the address range of the group thereof. Therefore, any group can generate an enable signal EN using a prohibited address. For example, in the case of the hit signal generation circuit 40 assigned to the group G1, when the fuse circuit F11 is in the state of not being programmed and the fuse circuits F12 and F13 in the state of being programmed, the hit signal generation circuit 40 turns out to be in the state of being disabled. In this manner, according to the present embodiment, in order for the hit signal generation circuits 40 assigned to the groups G0 to G6 to be in the state of being disabled, at least one of the fuse circuits F11 to F13 needs to be in the state of being programmed. However, the relation of connection between the fuse circuits F11 to F13 and the comparator circuits C11 to C13 can be the same in all the hit signal generation circuits 40.

Figure 14:
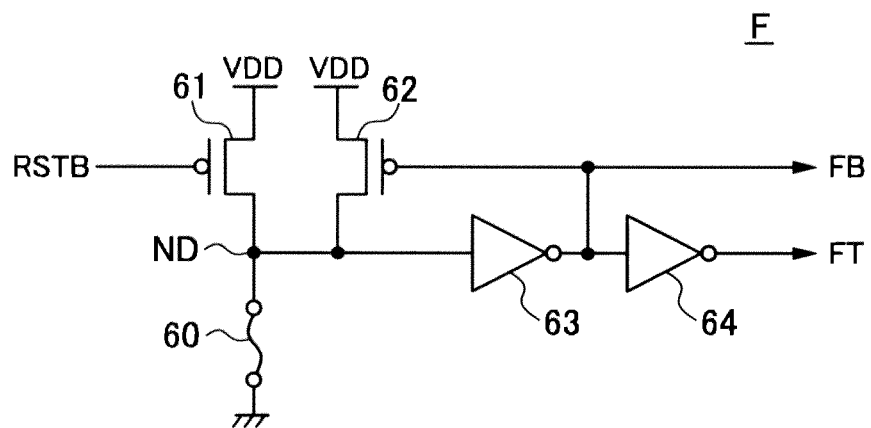
FIG. 14 is a circuit diagram of the fuse circuit F.

Turning to FIG. 14, there is a circuit diagram of the fuse circuit F. The fuse circuits F0 to F13 have the same circuit configuration. Therefore, when the fuse circuits F0 to F13 are not particularly distinguished from each other, the fuse circuits are simply referred to as "fuse circuits F."

As shown in FIG. 14, a fuse circuit F includes a fuse element 60, whose one end is grounded, and a fuse determination circuit, which reads information stored in the fuse element 60. The fuse determination circuit includes P-channel MOS transistors 61 and 62, which are connected in parallel between power supply potential VDD and the other end of the fuse element 60. To a gate electrode of the transistor 61, a reset signal RSTB is supplied. Therefore, when the reset signal RSTB becomes activated to a low level, the power supply potential VDD is applied to a connection contact point ND of the fuse element 60 and the transistors 61 and 62 as a result. A level of the connection contact point ND is output as a positive signal FT via inverters 63 and 64, and as a negative signal FB via the inverter 63. The negative signal FB is fed back to a gate electrode of the transistor 62. Therefore, when the reset signal RSTB becomes deactivated to a high level, a logical level read from the fuse element 60 is retained.

The reset signal RSTB is one of command signals supplied from the outside of the semiconductor device 10. The reset signal RSTB is a signal that is temporarily brought to a low level immediately after the power is turned on, and kept at a high level thereafter. Therefore, when the reset signal RSTB is brought to a low level immediately after the power is turned on, the connection contact point ND is connected to the power supply potential VDD via the transistor 61. At this time, if the fuse element 60 is in a conduction state, the potential of the connection contact point ND does not rise beyond a threshold value of the inverter 63. As a result, the positive signal FT is at a low level, and the negative signal FB is at a high level. In this case, the fuse element 60 being in a conduction state means that the fuse element 60 is in the state of not being programmed if the fuse element 60 is an optical fuse, or is in the state of being programmed if the fuse element 60 is an electrical fuse. The negative signal FB is fed back to the gate electrode of the transistor 62. Therefore, the transistor 62 is turned off. As a result, when the reset signal RSTB changes to a high level, the level of the connection contact point ND is fixed to a ground level.

Meanwhile, if the fuse element 60 is in a non-conduction state, after the transistor 61 is turned on by the reset signal RSTB, the potential of the connection contact point ND goes higher beyond a threshold value of the inverter 63. As a result, the positive signal FT is at a high level, and the negative signal FB at a low level. In this case, the fuse element 60 being in a non-conduction state means that the fuse element 60 is in the state of being programmed if the fuse element 60 is an optical fuse, or is in the state of not being programmed if the fuse element 60 is an electrical fuse. The negative signal FB is fed back to the gate electrode of the transistor 62. Therefore, the transistor 62 is turned on. As a result, when the reset signal RSTB changes to a high level, the level of the connection contact point ND is fixed to a power supply potential level.

Figure 15:
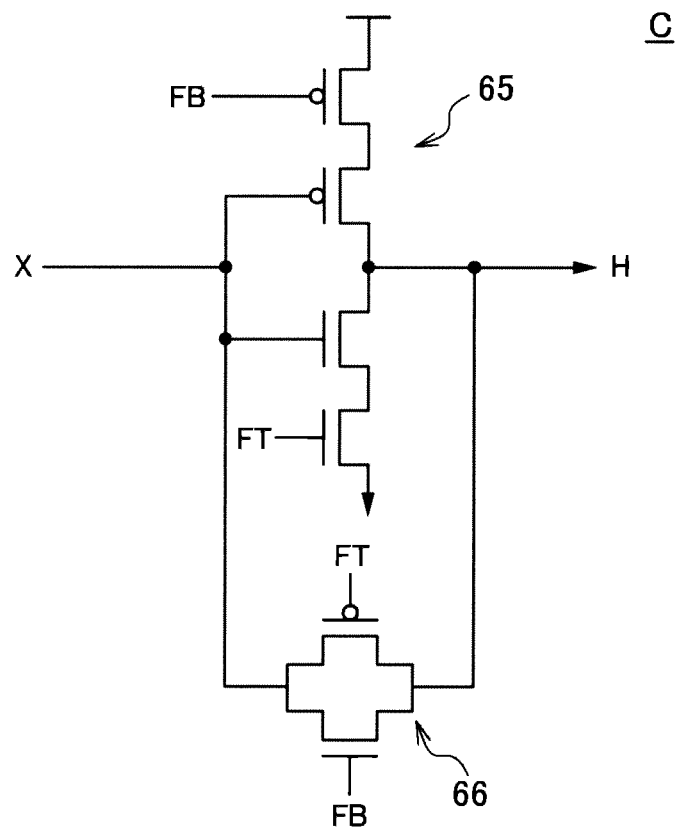
FIG. 15 is a circuit diagram of the comparison circuit C.

Turning to FIG. 15, there is a circuit diagram of the comparator circuit. The comparator circuits C0 to C13 have the same circuit configuration. Therefore, when the comparator circuits C0 to C13 are not particularly distinguished from each other, the comparator circuits are simply referred to as "comparator circuits C."

As shown in FIG. 15, a comparator circuit C has a structure in which a clocked inverter 65 and a transfer gate 65 are connected in parallel, with a corresponding address bit X used as an input signal. The clocked inverter 65 becomes activated when the positive signal FT is at a high level, and the negative signal FB at a low level, whereas the transfer gate 66 becomes activated when the positive signal FT is at a low level, and the negative signal FB at a high level. Accordingly, when the corresponding address bit X matches the logical level of the positive signal FT, a corresponding match signal H becomes activated to a high level. When both do not match each other, the corresponding match signal H becomes deactivated to a low level.

Figure 16:
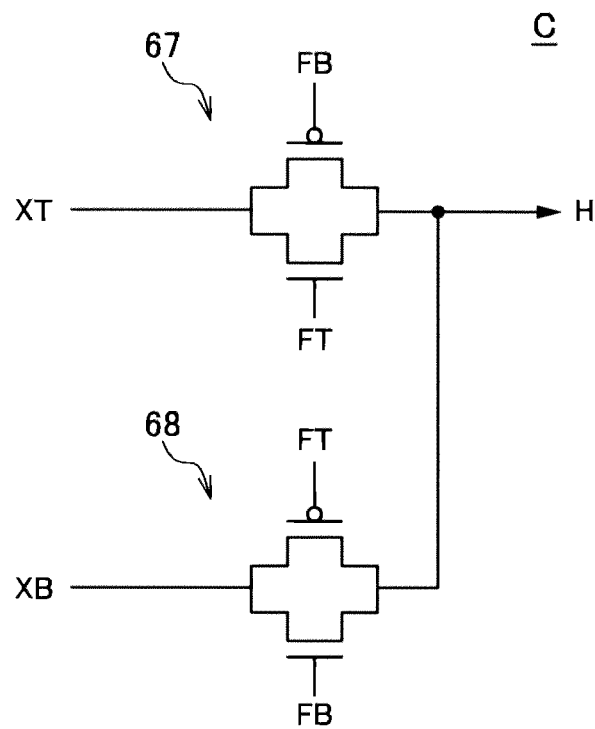
FIG. 16 is a circuit diagram of a first example of a comparator circuit C when a complementary address signal is used.

FIG. 16 is a circuit diagram of a first example of a comparator circuit C at a time when a complementary address signal is used. The comparator circuit C shown in FIG. 16 includes a transfer gate 67, which allows a positive signal XT of an address bit to pass therethrough, and a transfer gate 68, which allows a negative signal XB of an address bit to pass therethrough; and has a structure in which outputs of the transfer gates 67 and 68 are wired-OR connected. The transfer gate 67 becomes conductive when the positive signal FT of a corresponding fuse circuit F is at a high level, whereas the transfer gate 68 becomes conductive when the positive signal FT of a corresponding fuse circuit F is at a low level. Accordingly, when the corresponding address bits X0 to X13 match the outputs of the fuse elements F0 to F13, the comparator circuit C activates corresponding match signals H0 to H13 to a high level.

Figure 17:
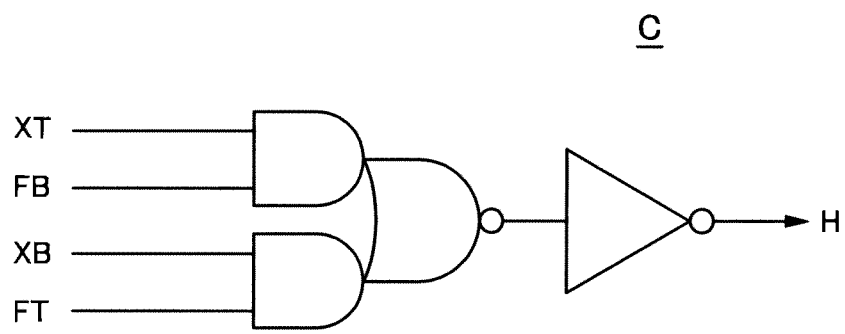
FIG. 17 is a circuit diagram of a second example of a comparator circuit C when a complementary address signal is used.

FIG. 17 is a circuit diagram of a second example of a comparator circuit C at a time when a complementary address signal is used. The comparator circuit C shown in FIG. 17 is a composite gate circuit, and carries out a logical sum and synthesis operation between a logical product output of a positive signal XT of an address bit and a negative signal FB of a fuse circuit F and a logical product output of a negative signal XB of an address bit and a positive signal FT of a fuse circuit F. As a result, the comparator circuit C performs a similar operation to that of the comparator circuit C shown in FIG. 16.

An operation of a hit signal generation circuit 40 will be explained with reference to FIG. 18.

Figure 18:
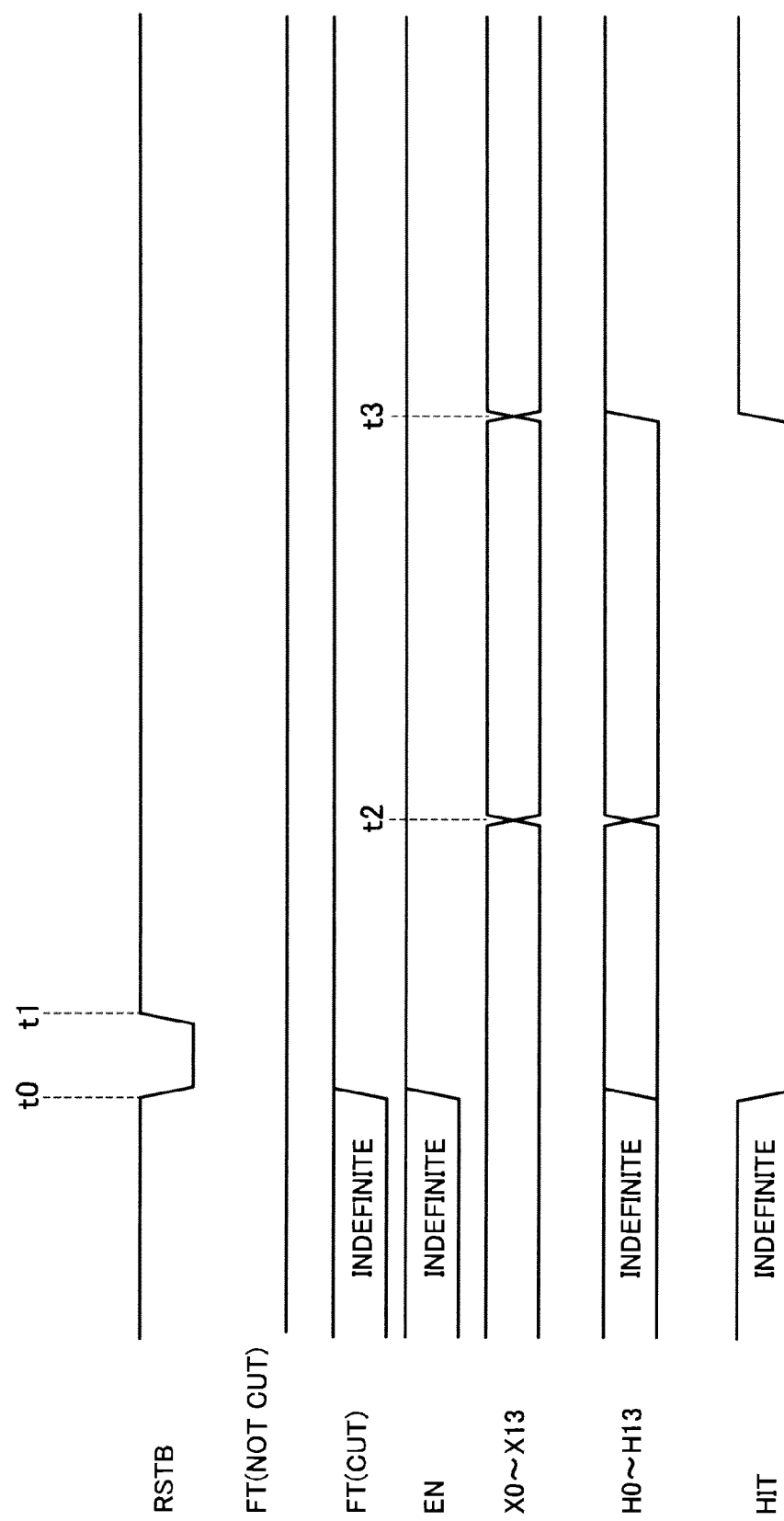
FIG. 18 is a timing chart illustrating an operation of a hit signal generation circuit 40 shown in FIG. 12.

As shown in FIG. 18, before time t0, when the power has just been turned on, the reset signal RSTB still remains at a high level. Therefore, the value of a positive signal FT output from a fuse circuit F is indeterminate. Then, when the reset signal RSTB becomes activated to a low level during a period of time t0 to t1, an operation of reading from a fuse element 60 is executed. Thus, if the fuse element 60 is in a conduction state (or in the state of not being cut in the case of an optical fuse), the positive signal FT is at a low level. If the fuse element 60 is in a non-conduction state (or in the state of being cut in the case of an optical fuse), the positive signal FT is at a high level. In the hit signal generation circuit 40 that is in the state of being used, an enable signal EN too is at a high level.

Then, after address signals, as well as an active command, are supplied from the outside at time t2 and t3, a comparison is made by the comparator circuits C0 to C13. Depending on the results of the comparison, the logical levels of the match signals H0 to H13 are determined. In the example shown in FIG. 18, the address signals X0 to X13 that are input at time t2 do not match the logical levels of the fuse circuits F0 to F13. Therefore, the hit signal HIT remains at a low level. On the other hand, the address signals X0 to X13 that are input at time t3 all match the logical levels of the fuse circuits F0 to F13. As a result, the hit signal HIT becomes activated to a high level. According to such an operation, a comparison operation is carried out every time the address signals are supplied along with the active command.

According to the configuration described above, when the address signals, which are supplied along with the active command, have all matched the values retained by the fuse circuits F0 to F13, one of the hit signals HIT0 to HIT15 is activated by the hit signal generation circuit 40. As a result, instead of a defective word line, one of the redundant word lines RWL0 to RWL15 is selected. Since the hit signal generation circuit 40 does not contain an enable fuse circuit, it is possible to reduce the number of fuse elements, which use a relatively large area. Moreover, as a circuit that generates the enable signal EN, only the three-input NAND gate circuit 42 is used. Therefore, a large area is not occupied by a circuit that generates the enable signal EN. Moreover, the enable signal EN shows the state of being disabled only when a replacement-prohibited address range is designated. Therefore, the rescue efficiency does not decrease.

A modified example of a hit signal generation circuit 40 will be explained next.

Figure 19:
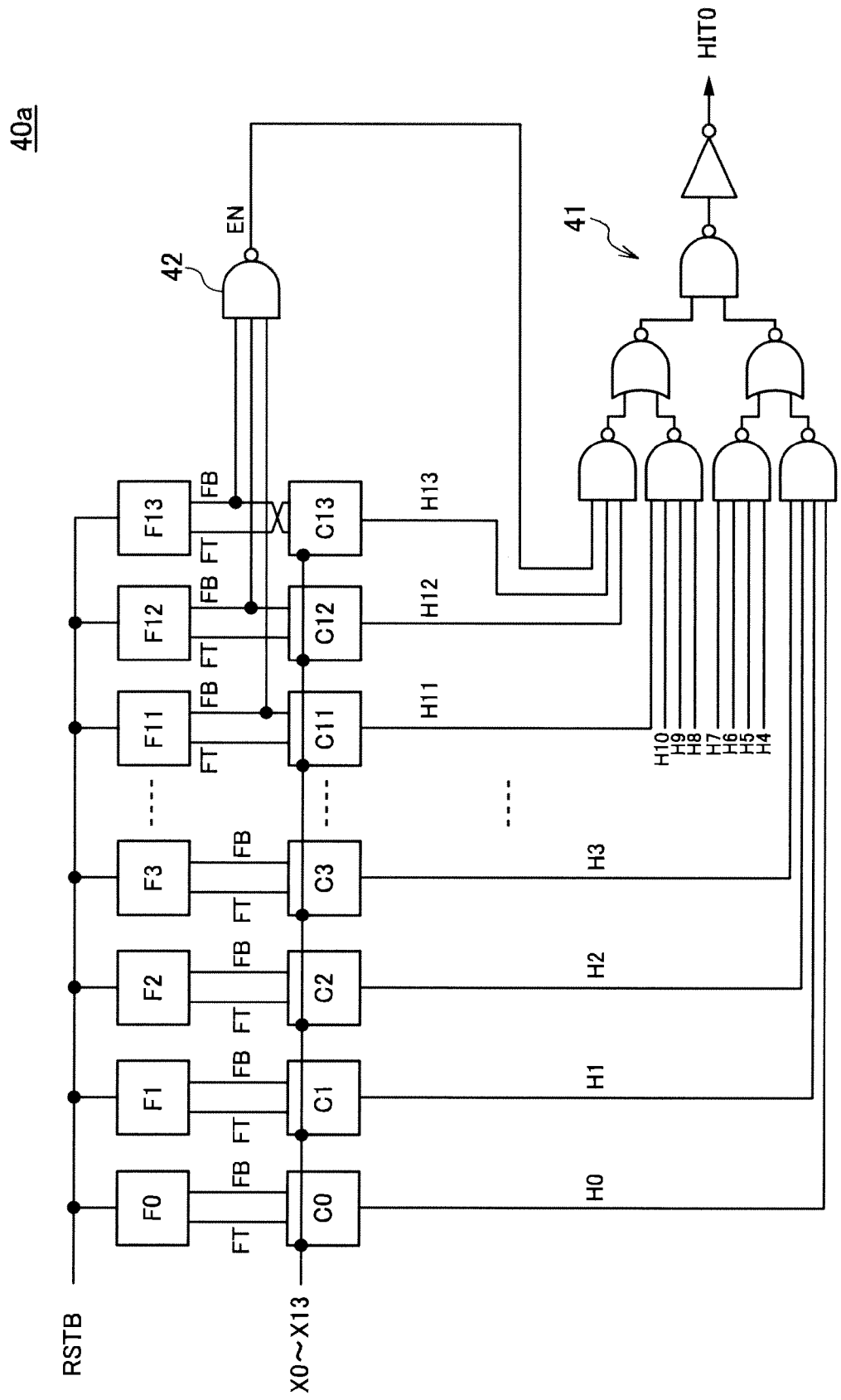

The hit signal generation circuit 40a shown in FIG. 19 is different from the above hit signal generation circuit 40 in that the positive output FT and negative output FB of the fuse circuit F13 are replaced with one another before being supplied to the comparator circuit C13. When the positive output FT and negative output FB of the fuse circuit F13 are replaced with one another, a comparison operation by the comparator circuit C13 turns out to be opposite to when the positive output FT and the negative output FB are not replaced. Accordingly, for example, if the fuse circuits F13 to F11 are all in the state of not being programmed, all the match signals H13 to H11 are brought to a high level at a time when the logical levels of the address bits X13 to X11 are (0, 1, 1).

Meanwhile, regardless of the replacement of the positive output FT and the negative output FB, the negative outputs FB of the fuse circuit F13 to F11 are input to the NAND gate circuit 42. Therefore, when the fuse circuits F13 to F11 are all in the state of not being programmed, the enable signal EN is at a low level, and the hit determination circuit 41 becomes deactivated. Therefore, if the above hit signal generation circuit 40a is assigned to the group G3 shown in FIG. 3, then the group G3 is prohibited from being used as a replacement source. That is, without having the fuse circuits F13 to F11 programmed, it is possible to deactivate the hit determination circuit 41.

Similarly, if an output of the fuse circuit, represented by "FT" in FIG. 11, is replaced, even in a hit signal generation circuit 40a assigned to any group, it is possible to put the hit signal generation circuit 40a in the state of not being used without being bothered to program the fuse circuit.

In that manner, if the hit signal generation circuit 40a of the modified example is used, a programming operation is not required for the hit signal generation circuit 40a that is not in use. As a result, it is possible to reduce the time required for programming the fuse circuit.

A modified example of a bank will be explained next.

Figure 20:
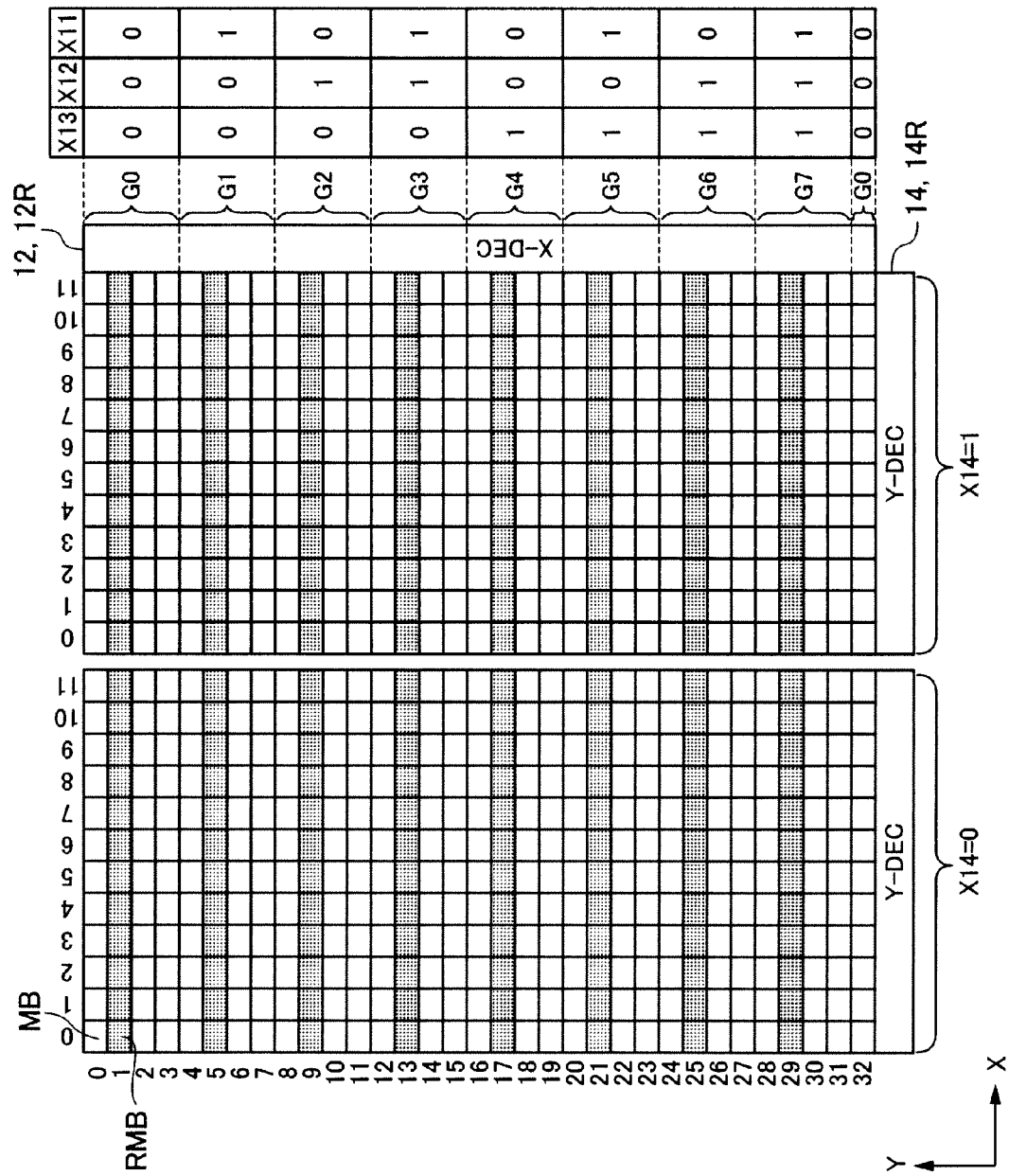
FIG. 20 is a schematic diagram illustrating the configuration of a bank according to a modified example.

In the example shown in FIG. 20, one bank is divided into 24 memory blocks in the X-direction, and into 33 memory blocks in the Y-direction. In the present example, in the 33 memory blocks divided in the Y-direction, each set of four blocks forms one group. As a result, eight groups G0 to G7 are formed. A group that is to be selected from among the groups is designated by address bits X13 to X11 of a row address.

Among the four memory blocks that make up each group, three are normal memory blocks MB containing no redundant word line, and the remaining one is a memory block RMB containing redundant word lines. In the example shown in FIG. 20, among the four memory blocks that make up each group, the second memory block from the top is a memory block RMB containing redundant word lines.

In the case of the above memory block configuration, for example, if a defective word line WL exists in the memory block MB3 belonging to the group G0, a problem does not arise in reality even when the defective word line WL is replaced with a redundant word line RWL in the memory block RMB1 belonging to the group G0. The reason is as follows: Since the memory block MB3 and the memory block RMB1 belong to the same group but are not adjacent to each other, the conflict of data does not occur even when the word lines WL and RWL in the memory blocks MB3 and RMB1 are simultaneously selected.

However, even in the case of the memory block configuration shown in FIG. 20, it is desirable that replacement within the same groups be completely prohibited. The reason is as follows: If replacement within the same groups is allowed conditionally, a complex circuit is required. In order to prohibit replacement within the same groups, the fuse circuits F13 to F11 corresponding to high-order bits are used; when the values of the fuse circuits F13 to F11 indicate the group thereof, the enable signal EN is deactivated.

The above has described, as an example, the case where the defective word line WL is replaced with the redundant word line RWL. The present invention may also be applied for the case where a defective bit line BL is replaced with a redundant bit line RBL. However, during the replacement of the bit line BL, unlike the replacement of the word line WL, the conflict of data does not occur. Therefore, the relationship between a replacement source and a replacement target is free. For example, when the bit line BL7 shown in FIG. 3 is a defective bit line, the defective bit line can be replaced with the redundant bit line RBL6 belonging to the adjoining memory block. Accordingly, when the present invention is applied for the replacement of a bit line BL, an arbitrary address range can be turned into prohibited addresses, whereas an address range in which the conflict of data occurs is turned into prohibited addresses in the case of the replacement of a word line WL. That is, when the address of a defective bit line BL that is arbitrarily prohibited as a replacement source is set, all that is required is to deactivate the enable signal EN.

Figure 21:
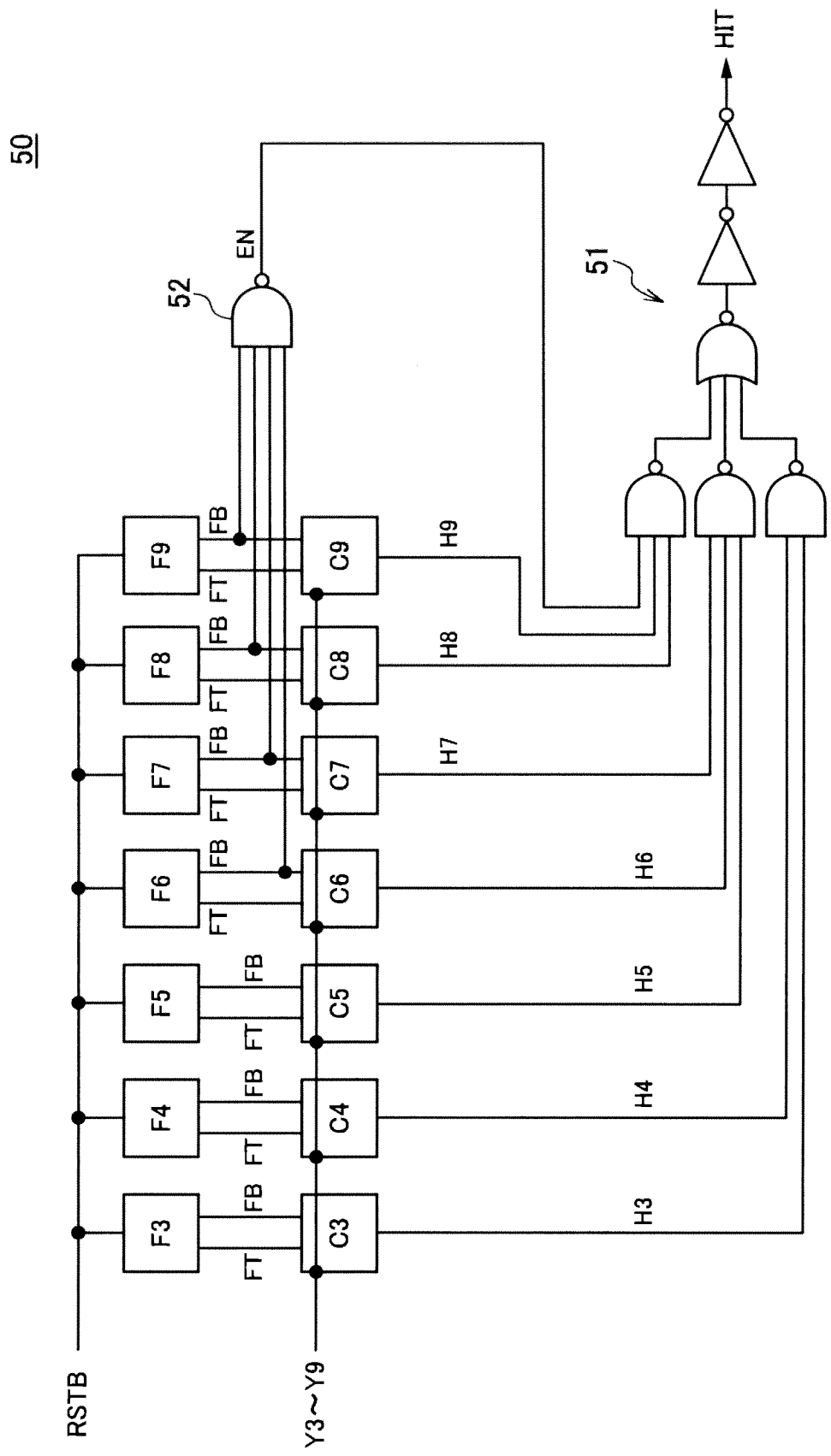
FIG. 21 is a circuit diagram of a hit signal generation circuit 50.

Turning to FIG. 21, a hit signal generation circuit 50 is used to replace a defective bit line BL with a redundant bit line RBL.

As shown in FIG. 21, the hit signal generation circuit 50 includes fuse circuits F3 to F9 and comparator circuits C3 to C9. The hit signal generation circuit 50 is included in the column redundant address determination circuit 25 shown in FIG. 1. No enable fuse circuit is provided. The fuse circuits F3 to F9 correspond to address bits Y3 to Y9 of a defective bit line BL to be replaced. In this case, the reason address bits Y2 to Y0 are not used is because a 8-bit prefetch is performed in SDRAM of a DDR3 (double Data Rate 3) type. The match signals H3 to H9 output from the comparator circuits C3 to C9 are supplied to a hit determination circuit 51.

Furthermore, the hit signal generation circuit 50 includes a NAND gate circuit 52, to which negative outputs FB of the fuse circuits F6 to F9 are input as input signals. An enable signal EN output from the NAND gate circuit 52 is supplied to the hit determination circuit 51. Thus, when at least one of the fuse circuits F6 to F9 is in the state of being programmed, and when the address bits Y3 to Y9 to which access is requested all match the outputs of the fuse elements F3 to F9, the hit determination circuit 51 activates a hit signal HIT to a high level. The hit signal HIT is a signal used to select a redundant bit line RBL.

As described above, as for the replacement of a bit line BL, there is no restriction on preventing the conflict of data. Essentially, the relationship between a replacement-source address and a replacement-target address is optional. However, according to the present embodiment, an address that causes all the fuse circuits F6 to F9 to be in the state of not being programmed is set as a prohibited address; the prohibited address causes the programmed hit signal generation circuit 50 to be in the state of being deactivated. Accordingly, no enable fuse circuit is required in the hit signal generation circuit 50. Therefore, it is possible to reduce an occupied space on the chip.

Incidentally, which outputs of the fuse circuits are referenced to generate the enable signal EN is optional. Therefore, in the example shown in FIG. 21, the enable signal EN is generated from the outputs of the fuse circuits F6 to F9. However, the present invention is not limited to the above. If a large number of fuse circuits that are referenced to generate the enable signal EN are set, the range of prohibited addresses can be made narrower, but the NAND gate circuit 52 increases in circuit size. Conversely, if a small number of fuse circuits referenced are set, the NAND gate circuit 52 can be small in circuit size, but the range of prohibited address becomes larger. In this manner, both are in a trade-off relationship. Thus, the number of fuse circuits that are referenced to generate the enable signal EN needs to be determined depending on the characteristics required and the like.

Figure 22:
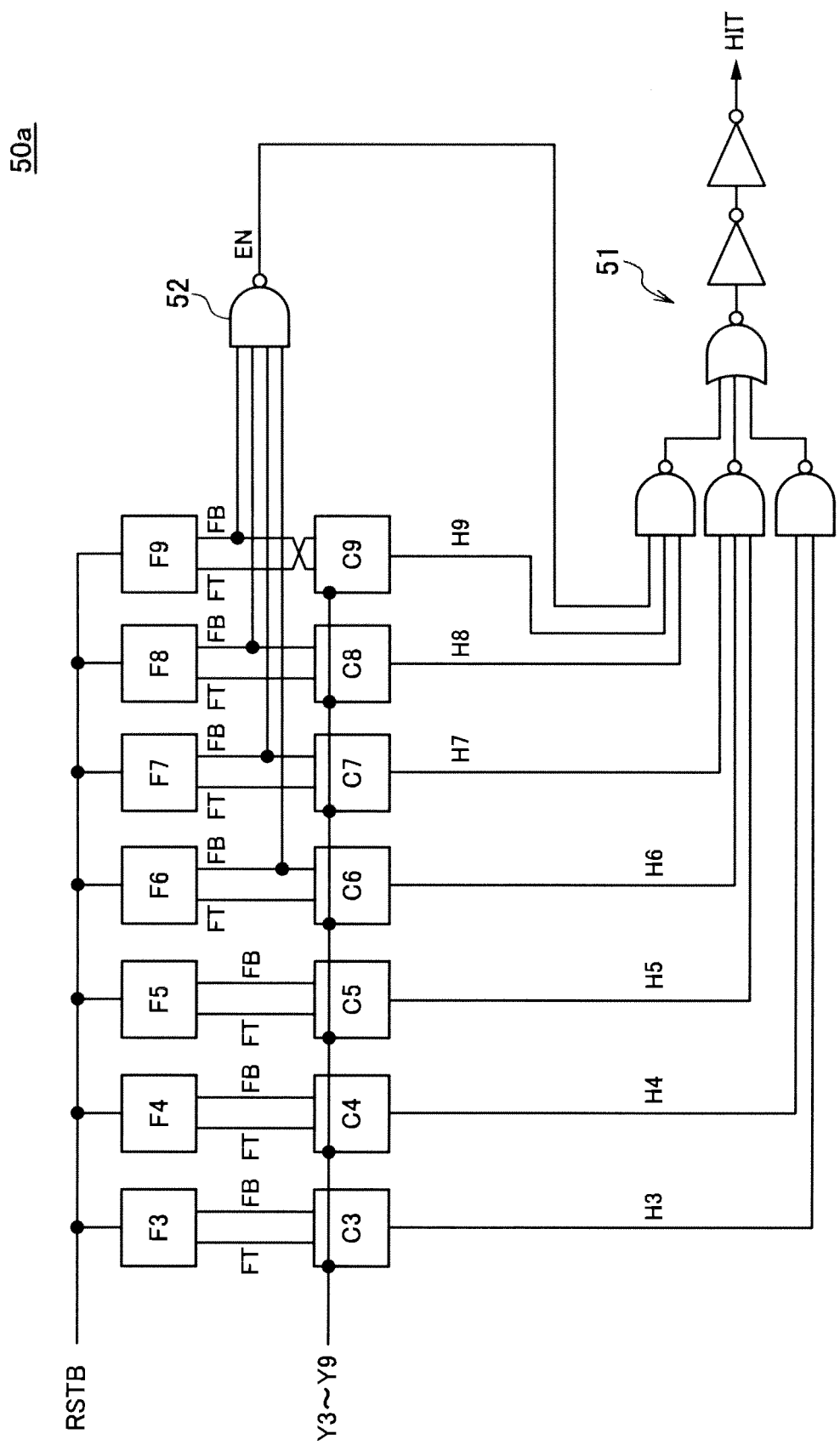

A modified example of a hit signal generation circuit 50a is shown in FIG. 22.

The hit signal generation circuit 50a shown in FIG. 22 is different from the above hit signal generation circuit 50 in that the positive output FT and negative output FB of the fuse circuit F9 are replaced with one another before being supplied to the comparator circuit C9. The significance thereof has been described in relation to FIG. 19. A programming operation is not required for the hit signal generation circuit 50a that is not in use. As a result, it is possible to reduce the time required for programming the fuse circuit.

An example of preferred arrangement of redundant bit lines RBL will be explained with reference to FIG. 23.

Figure 23:
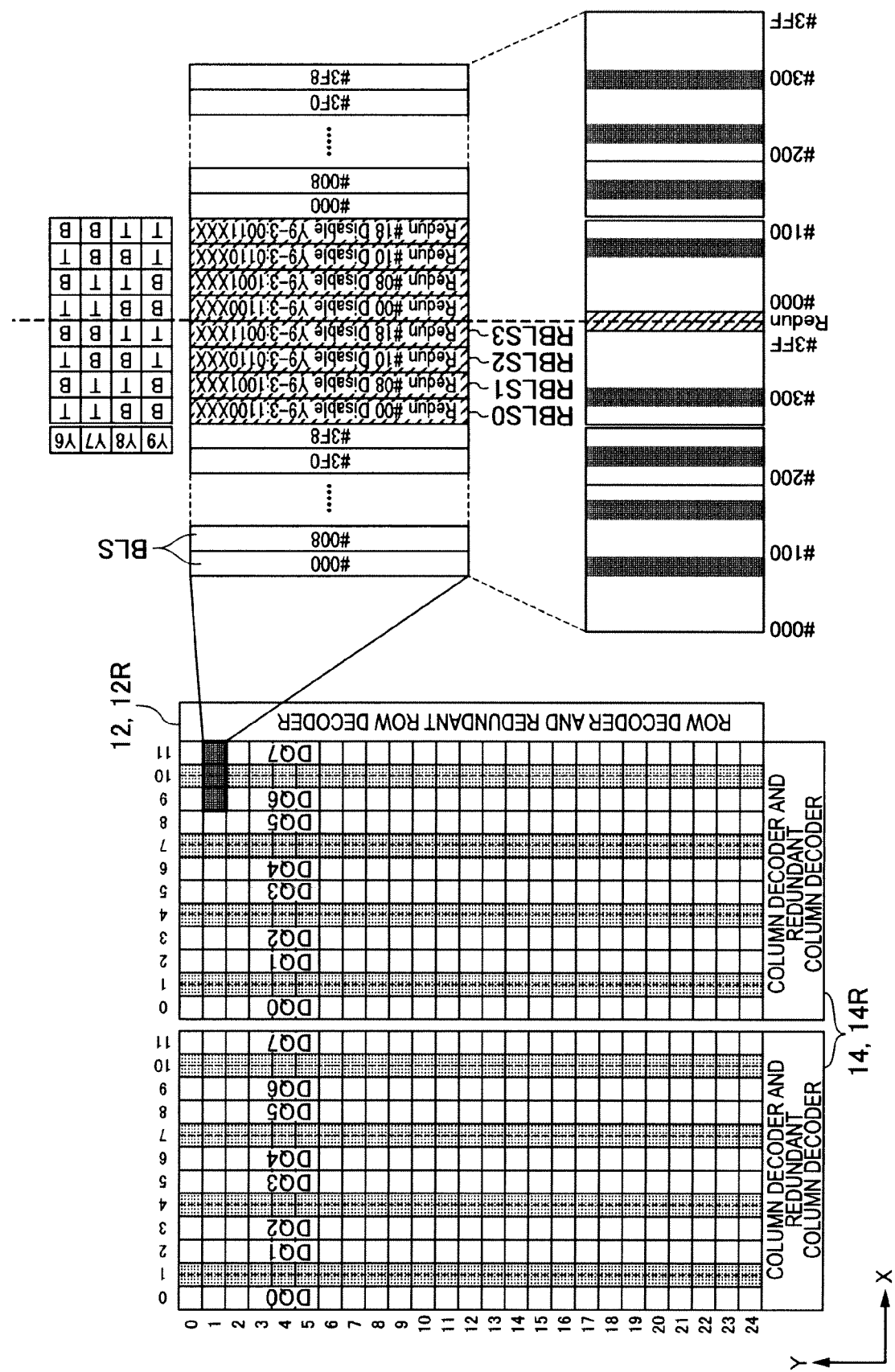
FIG. 23 is a schematic diagram showing an example of preferred arrangement of redundant bit lines RBL.

In the example shown in FIG. 23, each area selected by most significant bit X14 of a row address is divided into DQ0 to DQ7 areas in the X-direction. The DQ0 to DQ7 areas are areas corresponding to data DQ0 to DQ7 that are each input and output through the data input/output terminal 35. As described above, a 8-bit prefetch is carried out in the SDRAM of a DDR3 type. Therefore, during one access operation, eight bit lines BL are selected in each of the DQ0 to DQ7 areas, and 64-bit data are input and output in total.

The eight bit lines BL simultaneously selected in one DQ area form a bit line set BLS in FIG. 23. In one example, if the value of a column address is (000) in hexadecimal, the bit line set BLS represented by "#000" is selected. If the value of a column address is (008) in hexadecimal, the bit line set BLS represented by "#008" is selected.

In the present example, in one DQ area, four redundant bit line sets RBLS are provided. Each of the redundant bit line sets RBLS includes eight redundant bit lines RBL. As shown in FIG. 23, in the present example, in the DQ0, DQ2, DQ4 and DQ6 areas, the redundant bit line sets RBLS are disposed together in rightmost end portions of the areas. In the DQ1, DQ3, DQ5 and DQ7 areas, the redundant bit line sets RBLS are disposed together in leftmost end portions of the areas. In this manner, the regions where the redundant bit line sets RBLS are disposed are put together into four. Moreover, the regions are disposed at locations other than the end portions of the bank. Thus, in the end portions of the bank where the probability of defect occurrence is relatively high, no redundant bit line set RBLS is disposed.

In the example shown in FIG. 23, among the four redundant bit line sets RBLS provided in each DQ area, the redundant bit line set RBLS0 becomes disabled at a time when the values stored in the fuse circuits F9 to F6 are (1100). The redundant bit line set RBLS1 becomes disabled at a time when the values stored in the fuse circuits F9 to F6 are (1001). The redundant bit line set RBLS2 becomes disabled at a time when the values stored in the fuse circuits F9 to F6 are (0110). The redundant bit line set RBLS3 becomes disabled at a time when the values stored in the fuse circuits F9 to F6 are (0011). Incidentally, when the hit signal generation circuit 50 shown in FIG. 21 is used, as for an address bit represented by T in FIG. 23, the positive outputs FT may be connected to the NAND gate circuit 52. As for an address bit represented by B, the negative outputs FB may be connected to the NAND gate circuit 52. Moreover, when the hit signal generation circuit 50a shown in FIG. 22 is used, as for an address bit represented by T in FIG. 23, the positive output FT and the negative output FB are replaced with one another before being supplied to the comparator circuit C. As for an address bit represented by B, the positive output FT and the negative output FB are supplied to the comparator circuit C without being replaced with one another.

As a result, in the redundant bit line set RBLS0, the replacement of a defective bit line BL whose column address value is within the range of (300) to (33F) in hexadecimal is prohibited. In the redundant bit line set RBLS1, the replacement of a defective bit line BL whose column address value is within the range of (240) to (27F) in hexadecimal is prohibited. In the redundant bit line set RBLS2, the replacement of a defective bit line BL whose column address value is within the range of (180) to (1BF) in hexadecimal is prohibited. In the redundant bit line set RBLS3, the replacement of a defective bit line BL whose column address value is within the range of (0C0) to (0FF) in hexadecimal is prohibited. In FIG. 23, the prohibited addresses are shaded.

In that manner, the bit lines BL whose replacement targets are restricted are spread. Therefore, even when defective bit lines BL are unevenly distributed, the probability is high that all the defective bit lines BL can be replaced. Moreover, as for a bit line BL disposed near an end portion of the bank, there is no restriction on the replacement target. Therefore, the rescue efficiency of bit lines BL in the end portions of the bank where the probability of defect occurrence is relatively high does not decrease.

Up to this point, the preferred embodiment of the present invention has been described. However, the present invention is not limited to the foregoing embodiment. It will be understood that various modifications may be made without departing from the gist of the present invention, and such modifications are embraced within the scope of the present invention.

The technical concept of the present application can be applied to a semiconductor device having a volatile or nonvolatile memory. Moreover, the circuit form within each circuit block disclosed in the drawings, as well as a circuit that generates other control signals, is not limited to the circuit form disclosed in an example. Moreover, the memory cells and the redundant memory cells may be nonvolatile storage elements.

The technical idea of the present application can be applied to various semiconductor devices. For example, the present invention can be applied to a general semiconductor device such as a CPU (Central Processing Unit), an MCU (Micro Control Unit), a DSP (Digital Signal Processor), an ASIC (Application Specific Integrated Circuit), and an ASSP (Application Specific Standard Circuit), each of which includes a memory function. An SOC (System on Chip), an MCP (Multi Chip Package), and a POP (Package on Package) and so on are pointed to as examples of types of semiconductor device to which the present invention is applied. The present invention can be applied to the semiconductor device that has these arbitrary product form and package form.

When the transistors are field effect transistors (FETs), various FETs are applicable, including MIS (Metal Insulator Semiconductor) and TFT (Thin Film Transistor) as well as MOS (Metal Oxide Semiconductor). The device may even include bipolar transistors.

In addition, an NMOS transistor (N-channel MOS transistor) is a representative example of a first conductive transistor, and a PMOS transistor (P-channel MOS transistor) is a representative example of a second conductive transistor.

Many combinations and selections of various constituent elements disclosed in this specification can be made within the scope of the appended claims of the present invention. That is, it is needles to mention that the present invention embraces the entire disclosure of this specification including the claims, as well as various changes and modifications which can be made by those skilled in the art based on the technical concept of the invention.

What is claimed is:

1. A semiconductor device comprising:
a plurality of selection lines each connected to a plurality of memory cells, the selection lines being selected based on an access address to which access is requested;
a first hit signal generation circuit activating a first hit signal when the access address is coincident with a programmed address that designates a defective selection line included in the selection lines; and
a first redundant selection line connected to a plurality of first redundant memory cells, the first redundant selection line being selected when the first hit signal is activated,
wherein the first hit signal generation circuit deactivates the first hit signal when a value of the access address is in a first address range even if the access address is coincident with the programmed address.

2. The semiconductor device as claimed in claim 1, further comprising a decoder circuit that selects one of a plurality of the selection lines based on the access address regardless of whether or not the first hit signal is activated.

3. The semiconductor device as claimed in claim 1, wherein the access address is configured by a plurality of bits, a part of the bits of the access address in the first address range having a predetermined value.

4. The semiconductor device as claimed in claim 3, wherein the first hit signal generation circuit includes:
a plurality of fuse circuits each string an associated one of bits configuring the programmed address;
a plurality of comparator circuits each comparing an associated one of the bits of the access address and a bit stored in an associated one of the fuse circuits; and
a hit determination circuit activating the first hit signal when all the comparator circuits detect a coincident, the hit determination circuit being activated when the part of the bits of the access address is different from the predetermined value.

5. The semiconductor device as claimed in claim 4, wherein a part of the bits of the programmed address corresponding to the part of the bits of the access address indicates the predetermined value when all the fuse circuits corresponding to the part of the bits are in a non-programmed state.

6. The semiconductor device as claimed in claim 3, further comprising:
a second hit signal generation circuit activating a second hit signal when the access address is coincident with another programmed address that designates another defective selection line included in the selection lines; and
a second redundant selection line connected to a plurality of second redundant memory cells, the second redundant selection line being selected when the second hit signal is activated,
wherein the second hit signal generation circuit deactivates the second hit signal when a value of the access address is in a second address range different from the first address range even if the access address is coincident with the another programmed address.

7. The semiconductor device as claimed in claim 6, wherein the access address is configured by a plurality of bits, a part of the bits of each of the access addresses in the second address range having another predetermined value different from the predetermined value.

8. The semiconductor device as claimed in claim 1, wherein the selection lines are word lines, and the first redundant selection line is a redundant word line.

9. The semiconductor device as claimed in claim 8, wherein
the word lines include a plurality of first word lines selected when the access address is in the first address range, and
the first redundant memory cells and memory cells connected to the first word lines are connected to the same sense amplifier.

10. The semiconductor device as claimed in claim 1, wherein the selection lines are bit lines, and the first redundant selection line is a redundant bit line.

11. A semiconductor device comprising:
a plurality of selection lines each connected to a plurality of memory cells;
a first redundant selection line connected to a plurality of first redundant memory cells; and
a first hit signal generation circuit including a first storing unit, a first enable signal generation unit and a first hit signal generation unit, the first storing unit being configured to store a first defective address that comprises first and second address portions, the first enable signal generation unit receiving the first address portion of the first defective address without receiving the second address portion of the first defective address and producing a first enable signal in response to the first address portion, and the first hit signal generation unit receiving the first defective address, the first enable signal and an access address that is designates one of the selection lines and activating a first hit signal to activate the first redundant selection line when the first enable signal is supplied and the access address coincides with the first defective address.

12. The semiconductor device as claimed in claim 11, further comprising a decoder circuit that selects one of a plurality of the selection lines based on the access address regardless of whether or not the first hit signal is activated.

13. The semiconductor device as claimed in claim 11, wherein the first enable signal generation unit is free from producing the first enable signal when the first address portion of the first defective address is in a first range.

14. The semiconductor device as claimed in claim 13, further comprising:
a second redundant selection line connected to a plurality of second redundant memory cells;
a second hit signal generation circuit including a second storing unit, a second enable signal generation unit and a second hit signal generation unit, the second storing unit being configured to store a second defective address that comprises third and fourth address portions, the second enable signal generation unit receiving the third address portion of the second defective address without receiving the fourth address portion of the second defective address and producing a second enable signal in response to the third address portion, and the second hit signal generation unit receiving the second defective address, the second enable signal and the access address and activating a second hit signal to activate the second redundant selection line when the second enable signal is supplied and the access address coincides with the second defective address, and
wherein the second enable signal generation unit is free from producing the second enable signal when the third address portion of the second defective address is in a second range that is different from the first range.

15. The semiconductor device as claimed in claim 11, wherein the first storing unit includes a plurality of fuse circuits each string an associated one of bits configuring the first defective address, the first hit signal generation unit includes a plurality of comparator circuits each comparing an associated one of bits of the access address and a bit stored in an associated one of the fuse circuits.

16. The semiconductor device as claimed in claim 11, wherein the selection lines are word lines, and the first redundant selection line is a redundant word line.

17. The semiconductor device as claimed in claim 11, wherein the selection lines are bit lines, and the first redundant selection line is a redundant bit line.

18. A semiconductor device comprising:
a storing unit being configured to store a first address that comprises first and second address portions;
an enable signal generation unit receiving the first address portion of the first address without receiving the second address portion of the first address and producing an enable signal in response to the first address portion; and
an output signal generation unit receiving the first address, the enable signal and a second address, activating an output signal when the first enable signal is supplied and the second address coincides with the first address, and deactivating the output signal when the enable signal is not supplied.

19. The semiconductor device as claimed in claim 18, wherein the output signal generation unit deactivates the output signal when the second address does not coincide with the first address.

20. The semiconductor device as claimed in claim 18, wherein the storing unit includes a plurality of fuse circuits each string an associated one of bits configuring the first address.

* * * * *